United States Patent
Fujino et al.

(10) Patent No.: US 6,636,454 B2
(45) Date of Patent: Oct. 21, 2003

(54) LOW-POWER CONSUMPTION SEMICONDUCTOR MEMORY DEVICE

(75) Inventors: Takeshi Fujino, Hyogo (JP); Kazutami Arimoto, Hyogo (JP); Hiroki Shimano, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 1 day.

(21) Appl. No.: 09/756,272

(22) Filed: Jan. 9, 2001

(65) Prior Publication Data

US 2002/0001251 A1 Jan. 3, 2002

(30) Foreign Application Priority Data

Jun. 29, 2000 (JP) ........................................ 2000-196156

(51) Int. Cl.[7] ................................................. G11C 7/00
(52) U.S. Cl. ........................... 365/230.08; 365/230.01; 365/226; 365/231; 365/233; 365/230.03
(58) Field of Search ........................ 365/189.01, 230.01, 365/230.03, 230.06, 230.08, 231, 226, 233

(56) References Cited

U.S. PATENT DOCUMENTS

| | | | | |
|---|---|---|---|---|
| 5,894,448 A | * | 4/1999 | Amano et al. ......... | 365/230.08 |
| 6,088,286 A | * | 7/2000 | Yamauchi et al. ...... | 365/230.06 |
| 6,205,067 B1 | * | 3/2001 | Tsukude .................... | 365/201 |
| 6,205,071 B1 | * | 3/2001 | Ooishi ....................... | 365/207 |
| 6,246,614 B1 | * | 6/2001 | Ooishi ....................... | 365/191 |
| 6,314,042 B1 | * | 11/2001 | Tomishima et al. .... | 365/230.03 |
| 6,333,879 B1 | * | 12/2001 | Kato et al. ................. | 365/201 |

FOREIGN PATENT DOCUMENTS

| | | |
|---|---|---|
| JP | 59-129989 | 7/1984 |
| JP | 4-184787 | 7/1992 |

* cited by examiner

Primary Examiner—Viet Q. Nguyen
(74) Attorney, Agent, or Firm—McDermott, Will & Emery

(57) ABSTRACT

A memory cell unit includes a first storage element and a second storage element for storing complementary data with each other. In a selected state, the first and second storage elements are connected to complementary bit lines, respectively at a time. In a standby state, the bit lines are precharged to a voltage (Vccs or GND) corresponding to the data stored in the memory cell unit. Refresh-free, low-current-consumption semiconductor memory device operating stably even under a low power supply voltage can be implemented.

8 Claims, 19 Drawing Sheets

: H-DATA SENSING

: L-DATA SENSING

: H-DATA SENSING

: L-DATA SENSING

: H-DATA SENSING

: L-DATA SENSING

: CONVENTIONAL

: PRESENT INVENTION

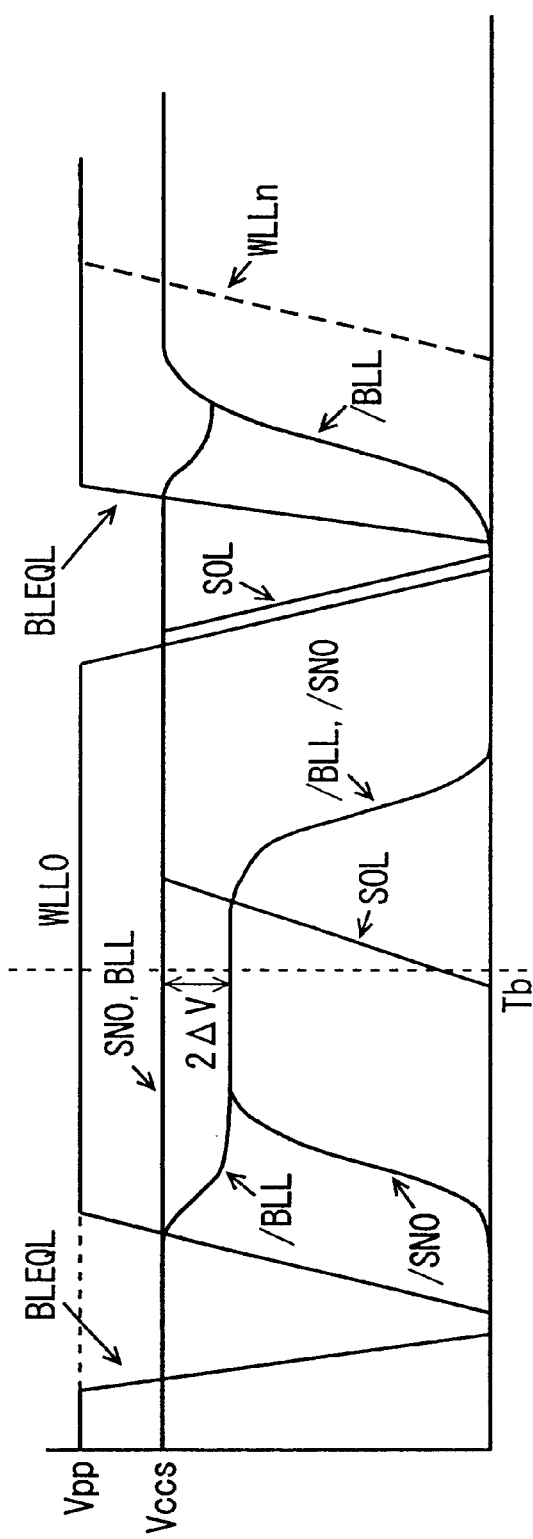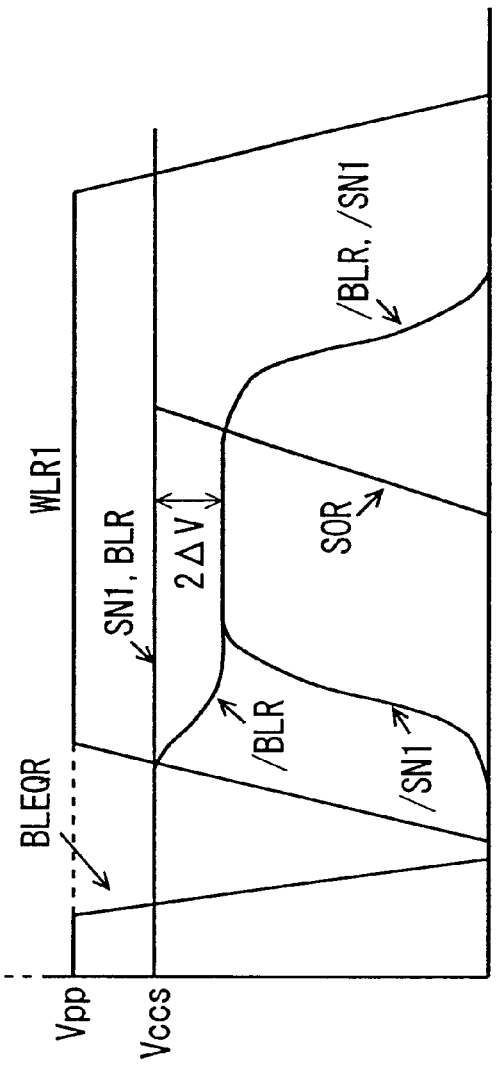
F I G. 1 9 A
F I G. 1 9 B

: H-DATA SENSING

: L-DATA SENSING

LOW-POWER CONSUMPTION SEMICONDUCTOR MEMORY DEVICE

BACKGROUND OF THE INVENTION

1. Field of the Invention

The present invention generally relates to a semiconductor memory device, and particularly to a dynamic semiconductor memory device with information stored in a capacitor. More particularly, the present invention relates to a dynamic semiconductor memory device suitable for integration into a system LSI large scale integrated circuit) and operating under a low power supply voltage.

2. Description of the Background Art

A dynamic random access memory (DRAM) is generally used in order to implement a mass storage memory in a system LSI with a memory and a logic integrated therein. The DRAM includes memory cells each formed of a single capacitor and a single transistor, and therefore, the memory cell occupies a small area. Moreover, the cost per bit is inexpensive. As a result, the DRAM can implement a mass storage memory with a small occupying area.

FIG. 27 is a diagram schematically showing the structure of a main part of a conventional DRAM. FIG. 27 shows memory cells MC0 and MC1 arranged in two rows and one column in a memory cell array. Bit lines BL and /BL are provided for the memory cell column, and a word line WL (WL0, WL1) are provided for each memory cell row. In FIG. 27, memory cell MC0 is located at an intersection of bit line BL and word line WL0, whereas memory cell MC1 is located at an intersection of bit line /BL and word line WL1.

Each of memory cells MC0, MC1 includes a capacitor Cs for storing information, and an accessing MOS transistor (insulated-gate field effect transistor) MT. Each access transistor MT is connected through a capacitor contact to an associated memory cell capacitor Cs, and also connected through a bit line contact to a corresponding bit line BL or /BL. An electrode node of each capacitor Cs connected to the capacitor contact is referred to as a storage node SN (SN0, SN1). Charges according to the stored data are accumulated in storage node SN. A cell-plate voltage Vcp (=Vccs/2) is applied to the other electrode node (cell-plate electrode node) of each memory cell capacitor Cs.

Memory cells MC0 and MC1 store information by charges accumulated in the respective storage nodes SN0 and SN1. Usually, word lines WL0 and WL1 receive a high voltage Vpp of about 3.6 V, higher than a sense power supply voltage, when selected. Such high voltage Vpp is applied in order to write high-level data of a sufficiently high voltage level (sense power supply voltage) to storage nodes SN0 and SN1 without a threshold-voltage loss across the corresponding access transistors MT. Bit lines BL and /BL have a voltage amplitude of about 2.0 V (=Vccs). The state in which data at a voltage Vccs level is stored in storage node SN0 or SN1 is referred to as high-level data storage, whereas the state in which data at a ground-voltage GND level is stored in storage node SN0 or SN1 is referred to as low-level data storage.

A circuit for reading the data stored in memory cell MC0 or MC1 is called a sense amplifier circuit. The sense amplifier circuit includes a sense amplifier 900 that is activated to differentially amplify a voltage on bit lines BL and /BL, and sense activation transistors PQ3 and NQ3 responsive to respective sense amplifier activation signals /SOP and SON for transmitting a power supply voltage Vccs and ground voltage GND to internal power source nodes of sense amplifier 900, respectively. Sense amplifier 900 includes a P-channel MOS transistor PQ1 connected between a first internal power source node and bit line BL and having its gate connected to bit line /BL, a P-channel MOS transistor PQ2 connected between the first internal power source node and bit line /BL and having its gate connected to bit line BL, an N-channel MOS transistor NQ1 connected between bit line BL and a second internal power source node and having its gate connected to bit line /BL, and an N-channel MOS transistor NQ2 connected between bit line /BL and the second internal power source node and having its gate connected to bit line BL. Sense amplifier activation transistor PQ3 formed by a P-channel MOS transistor is rendered conductive in response to activation of sense amplifier activation signal /SOP for transmitting sense power supply voltage Vccs to the first internal power source node. Sense amplifier activation transistor NQ3 formed by an N-channel MOS transistor is rendered conductive in response to activation of sense amplifier activation signal SON for transmitting ground voltage GND to the second internal power source node.

A bit-line precharging/equalizing circuit 902 is further provided in order to precharge and equalize bit lines BL and /BL to an intermediate voltage in the standby state. Bit-line precharging/equalizing circuit 902 includes N-channel MOS transistors NQ4 and NQ5 rendered conductive in response to activation of a bit-line equalization instruction signal BLEQ for transmitting a bit-line precharge voltage VBL (=Vccs/2) to bit lines BL and /BL, and an N-channel MOS transistor NQ6 rendered conductive in response to activation of bit-line equalization instruction signal BLEQ for electrically short-circuiting bit lines BL and /BL.

Bit-line precharging/equalizing circuit 902 is used to precharge and equalize bit lines BL and /BL to the intermediate voltage level during the standby state. As a result, bit lines BL and /BL have a reduced amplitude in sensing operation, whereby high-speed sensing as well as reduction in a sense current are achieved. Now, the operation of reading the data in the memory cells shown in FIG. 27 is briefly described with reference to FIGS. 28 and 29.

Referring first to FIG. 28, a sensing operation for reading high-level data (H data) stored in storage node SN0 of memory cell MC0 is described. In the standby state, bit lines BL and /BL are precharged and equalized to the intermediate voltage Vccs/2 level by bit-line precharging/equalizing circuit 902. Sense amplifier activation signal /SOP is at the sense power supply voltage Vccs level, whereas sense amplifier activation signal SON is at the ground voltage GND level. Accordingly, sense amplifier activation transistors PQ3 and NQ3 are both in the OFF state.

When an active cycle is started, bit-line equalization instruction signal BLEQ first becomes inactive, whereby bit-line precharging/equalizing circuit 902 is deactivated. Thus, bit lines BL and /BL are brought into a floating state at the intermediate voltage Vccs/2 level.

Then, a row selecting operation is performed according to an address signal not shown, and word line WL0 is selected. The selected word line WL0 is driven to the high voltage Vpp level that is higher than sense power supply voltage Vccs. Access transistor MT of memory cell MC0 is rendered conductive in response to the voltage rise on word line WL0. As a result, storage node SN0 is coupled to bit line BL, and charges accumulated in storage node SN0 are transmitted onto bit line BL. Since H data (high level data) is stored in storage node SN0, bit line BL voltage is raised by a reading voltage ΔV from precharge voltage Vccs/2 (the voltage levels on bit line BL and storage node SN0 become equal to each other). However, since there is no memory cell arranged at the intersection of bit line /BL and word line WL0, bit line /BL is maintained at the precharge-voltage Vccs/2 level.

When the voltage difference between bit lines BL and /BL, i.e., the reading voltage ΔV, is sufficiently developed, sense amplifier activation signals SON and /SOP are activated. As a result, sense amplifier activation transistors PQ3 and NQ3 are rendered conductive, and sense amplifier 900 starts the sensing operation. During the sensing operation, sense amplifier 900 differentially amplifies the read voltage ΔV on bit lines BL and /BL, thereby driving bit line BL to the sense power supply voltage Vccs level and bit line /BL to the ground voltage level.

Referring now to FIG. 29, a sensing operation for reading low-level data (L data) stored in storage node SN0 of memory cell MC0 is described.

This L-data sensing operation is the same as the H-data sensing operation of FIG. 28 until word line WL0 is driven to the high voltage Vpp level. In the case where the L data is stored in storage node SN0, bit line BL voltage lowers from the intermediate voltage, whereby the voltage levels on storage node SN0 and bit line BL finally become equal to each other. Then, sense amplifier activation signals SON and /SOP are activated. As a result, sense amplifier 900 operates to drive bit line BL to the ground voltage level (L level) and bit line /BL to the sense power supply voltage Vccs level.

In the H-data read operation, bit line BL attains a voltage V(HBL) as given by the following expression:

$$V(HBL)=(1+1/(1+Cb/Cs)) \cdot Vccs/2$$

, where Cb indicates parasitic capacitance of bit line BL, and Cs indicates a capacitance value of memory cell capacitor Cs. In the L-data read operation, bit line BL attains a voltage V(LBL) as given by the following expression:

$$V(LBL)=(1-1/(1+Cb/Cs)) \cdot Vccs/2.$$

Thus, read voltage ΔV is the same in both the H-data and L-data read operations, as given by the following expression:

$$\Delta V=(1/(1+Cb/Cs)) \cdot Vccs/2.$$

Read voltage ΔV in the H-data read operation is made equal to that in the L-data read operation, to read the H data and L data with the same sense margin at a faster sense timing.

In the conventional DRAM, the memory cell data is read onto one of the bit-lines BL, /BL, and the other bit line is maintained at the precharge voltage. Whether the memory cell data read onto one bit line is H data or L data is determined by comparing the voltage on one bit line with a reference voltage (the precharge voltage on the other bit line).

In memory cell MC (MC0, MC1), a capacitor contact region of the access transistor is an impurity region (source/drain region) formed at the surface of a semiconductor substrate. Accordingly, charges accumulated in storage node SN (SN0, SN1) disappear due to a junction leak current from the impurity region to the substrate region.

More specifically, as shown in FIG. 30, in the case of the H-data storage, storage node SN falls in voltage exponentially with time from the sense power supply voltage Vccs level due to the junction leak current. In the case of the L-data storage, the substrate region is biased to a negative voltage Vbb level, and storage node SN similarly falls in voltage exponentially from ground voltage GND. Accordingly, when the voltage at the storage node storing H-data reaches precharge voltage Vccs/2 at time Tref, whether the memory cell data is at the H level or L level can no longer be determined.

If the voltage at the storage node is further lowered from the precharge voltage Vccs/2 after time Tref, the H data is determined to be L data, resulting in misreading of the data. Therefore, a so-called refresh operation of reading and re-writing the memory cell data must be performed in order to restore the reduced H-data voltage to the original sense power supply voltage Vccs. In the case of the voltage change as shown in FIG. 30, the refresh operation must be performed at time intervals shorter than period Tref.

In miniaturizing DRAM elements, various parameters are proportionally reduced according to the scaling rules. According to the scaling rules, as a DRAM memory cell is miniaturized, impurity concentration of the source/drain region of the access transistor is increased in order to reduce the junction depth. Therefore, impurity concentration of the capacitor contact region of the access transistor is increased, and the junction leak current is increased accordingly (since the difference in impurity concentration between the substrate region and the source/drain region is increased), whereby time period Tref is shortened. Accordingly, the refresh operation must be performed frequently at shorter time intervals. In the normal operation mode, access to the DRAM is not allowed during such a refresh operation. Therefore, a processor is kept in a waiting state, resulting in reduced processing efficiency.

Moreover, in order to sense the L data, N-channel MOS transistors NQ1 and NQ2 in the sense amplifier 900 as shown in FIG. 27 must be turned ON under the condition that their gate-source voltages are lower than Vccs/2. Therefore, N-channel MOS transistors NQ1 and NQ2 must have a threshold voltage lower than the bit-line precharge voltage. Similarly, in order to sense the H data, P-channel MOS transistors PQ1 and PQ2 must be rendered conductive under the condition that their gate-source voltages are lower than intermediate voltage Vccs/2. However, if the absolute value of threshold voltage of an MOS transistor is reduced, a sub-threshold current (off-leak current) is increased.

FIG. 31 is a diagram showing a voltage at each node of sense amplifier 900 after the sensing operation is completed. In FIG. 31, bit lines BL and /BL are respectively driven to sense power supply voltage Vccs and ground voltage GND. In this state, the gate of MOS transistor PQ1 is at the ground voltage level, but the source and drain thereof are both at the sense power supply voltage Vccs level. Therefore, no current flows through MOS transistor PQ1. However, the gate and source of MOS transistor PQ2 are both at the sense power supply voltage Vccs, and the drain thereof is at the ground voltage GND level. In this case, an off-leak current Ioff1 flows from internal power supply node 900a into bit line /BL through MOS transistor PQ2. The leak current further flows through MOS transistor NQ2 into second internal power source node 900b.

The gate and source of MOS transistor NQ1 are both at the ground voltage GND, but bit line BL is at the sense power supply voltage Vccs level. Therefore, due to the current from bit line BL and P-channel MOS transistor PQ1, an off-leak current Ioff2 flows through MOS transistor NQ1.

Off-leak currents Ioff1 and Ioff2 increase as the absolute value of a threshold voltage is reduced. In other words, a leak current Icc3 flowing in a so-called active standby state after the sensing operation is completed is increased. Particularly, in the case of a multi-bank structure, this leak current is increased when a plurality of sense amplifier bands are all in the active standby state. Thus, in the case where an array power supply voltage, i.e., an operating power supply voltage of the sense amplifier circuitry, is to be set to 1.5 V or less, for example, a threshold voltage of the sense amplifier transistors must be reduced to as low as 0.4 V or less. As a result, the active standby current (Icc3) is disadvantageously increased.

SUMMARY OF THE INVENTION

It is an object of the present invention to provide a semiconductor memory device capable of being driven with a low voltage and having long refresh intervals.

It is another object of the present invention to provide a semiconductor memory device having low current consumption and improved access efficiency.

A semiconductor memory device according to one aspect of the invention includes a plurality of unit cells arranged in a matrix rows and columns. Each of the plurality of unit cells includes first and second storage elements each including a transistor and a capacitor.

The semiconductor memory device according to the one aspect of the invention further includes a plurality of bit line pairs provided corresponding to respective columns, and each connecting to the unit cells of a corresponding column. Each of the bit line pairs includes first and second bit lines respectively coupled to the first and second storage elements of the unit cells of a corresponding column.

The semiconductor memory device according to the one aspect of the invention further includes a plurality of row selection lines provided corresponding to respective rows, and each connecting to the unit cells of a corresponding row. Each of the row selection lines includes a first word line to which the first storage elements of the unit cells of a corresponding row are connected, and a second word line to which the second storage elements of the unit cells of the corresponding row are connected.

The semiconductor memory device according to the one aspect of the invention further includes a row selection circuit for driving both the first and second word lines of a row selection line corresponding to an addressed row into a selected state according to an address signal, and a bit-line voltage setting circuit for setting the voltage on the first and second bit lines of each bit line pair to a voltage level different from a predetermined voltage in a standby state, the predetermined voltage being equal to half a sum of voltages respectively corresponding to high-level and low-level data stored in the first and second storage elements.

A semiconductor memory device according to another aspect of the invention includes a plurality of unit cells arranged in a matrix of rows and columns. Each of the plurality of unit cells has first and second storage elements. The first storage element includes first and third transistors, and a first capacitor connected to the first and third transistors. The second storage element includes second and fourth transistors, and a second capacitor connected to the second and fourth transistors.

The semiconductor memory device according to the another aspect of the invention further includes a plurality of first-port bit line pairs provided corresponding to respective columns and each having the unit cells of a corresponding column connected thereto, and a plurality of second-port bit line pairs provided corresponding to the respective columns and each having the unit cells of a corresponding column connected thereto. Each of the first-port bit line pairs includes a first first-port bit line coupled to the first transistor, and a second first-port bit line coupled to the second transistor. Each of the second-port bit line pairs includes a first second-port bit line coupled to the third transistor, and a second second-port bit line coupled to the fourth transistor.

The semiconductor memory device according to the another aspect of the invention further includes: a plurality of first-port word lines provided corresponding to respective rows, and each connecting to the first and second transistors of the unit cells of a corresponding row; a plurality of second-port word lines provided corresponding to the respective rows, and each connecting to the third and fourth transistors of the unit cells of a corresponding row; a first-port bit-line voltage setting circuit provided corresponding to each of the first-port bit line pairs for setting a respective voltage on the first and second first-port bit lines of each first-port bit-line pair to a voltage level different from a predetermined voltage level when the first-port word lines are in a non-selected state, the predetermined voltage level being equal to half a sum of voltages respectively corresponding to high-level and low-level data stored in the first and second storage elements; and a second-port bit-line voltage setting circuit for setting a respective voltage on the first and second second-port bit lines of each second-port bit line pair to a voltage level different from the predetermined voltage level when the second-port word lines are in the non-selected state.

A semiconductor memory device according to still another aspect of the invention includes a plurality of first bit lines extending in a column direction, and a plurality of second bit lines extending in the column direction alternately with the plurality of first bit lines. The first and second bit lines are provided so that the adjacent first and second bit lines make a bit-line set.

The semiconductor memory device according to the still another aspect of the invention further includes an active region extending in the column direction under the first and second bit lines of each set in alignment with the first and second bit lines of a corresponding set as viewed two-dimensionally. These active regions are regions for forming transistors, and the adjacent active regions in the row direction are isolated from each other by a corresponding insulating region.

The semiconductor memory device according to the still another aspect of the invention further includes a plurality of first word lines extending in the row direction, and a plurality of second word lines extending in the row direction. The plurality of second word lines are arranged alternately with the plurality of first word lines, and the adjacent first and second word lines make a word-line set.

The semiconductor memory device according to the still another aspect of the invention further includes a capacitor provided between the first and second word lines of each set. These capacitors are aligned in the row and column directions.

The semiconductor memory device according to the still another aspect of the invention further includes a plurality of first bit-line contacts provided for first bit lines so as to align in the row direction, each for making an electrical contact between a corresponding first bit line and a corresponding active region, and a plurality of second bit-line contacts provided for second bit lines so as to align in the row direction, each for making a contact between a corresponding second bit line and a corresponding active region. The second bit-line contacts are provided corresponding to the first bit-line contacts so that each second bit-line contact is located opposite to a corresponding first bit-line contact with respect to a corresponding capacitor contact for making a contact between a corresponding capacitor and a corresponding active region. The first and second bit-line contacts are arranged sandwiching a set of the first and second word lines. Moreover, the first and second bit-line contacts are located at prescribed intervals along the column direction.

By reading the memory cell data onto a bit line pair, the voltage difference between the bit line pair becomes twice that in the conventional structure. Therefore, a sufficiently long refresh interval can be obtained.

Moreover, by setting the bit lines to the voltage level of the data, the sensing transistors in the sense amplifier circuitry can be turned ON as soon as the bit line voltage is shifted by the threshold voltage of the sensing transistors from the data voltage level. Accordingly, the threshold voltage of the transistor in the sense amplifier circuitry can be increased, and the sense power supply voltage can be reduced. As a result, a semiconductor memory device driven with a low voltage and having a low current consumption can be implemented.

Moreover, the active regions extend in the same direction as that of the bit lines, and the active regions are isolated from each other in the row direction by an isolating region. The first-port and second-port bit-line contacts are alternately arranged along the column direction so as to be opposite to each other with respect to a corresponding capacitor contact in each set. Accordingly, the memory cells forming the first and second storage elements are arranged efficiently, whereby four-transistor/two-capacitor memory cells can be formed with a small occupying area. Moreover, the layout pattern is made regular in the row and column direction, whereby accurate patterning is assured.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 19A and 19B are signal waveform charts representing an operation of the semiconductor memory device shown in FIG. 18.

DESCRIPTION OF THE PREFERRED EMBODIMENTS

[Embodiment 1]

Figure 1:
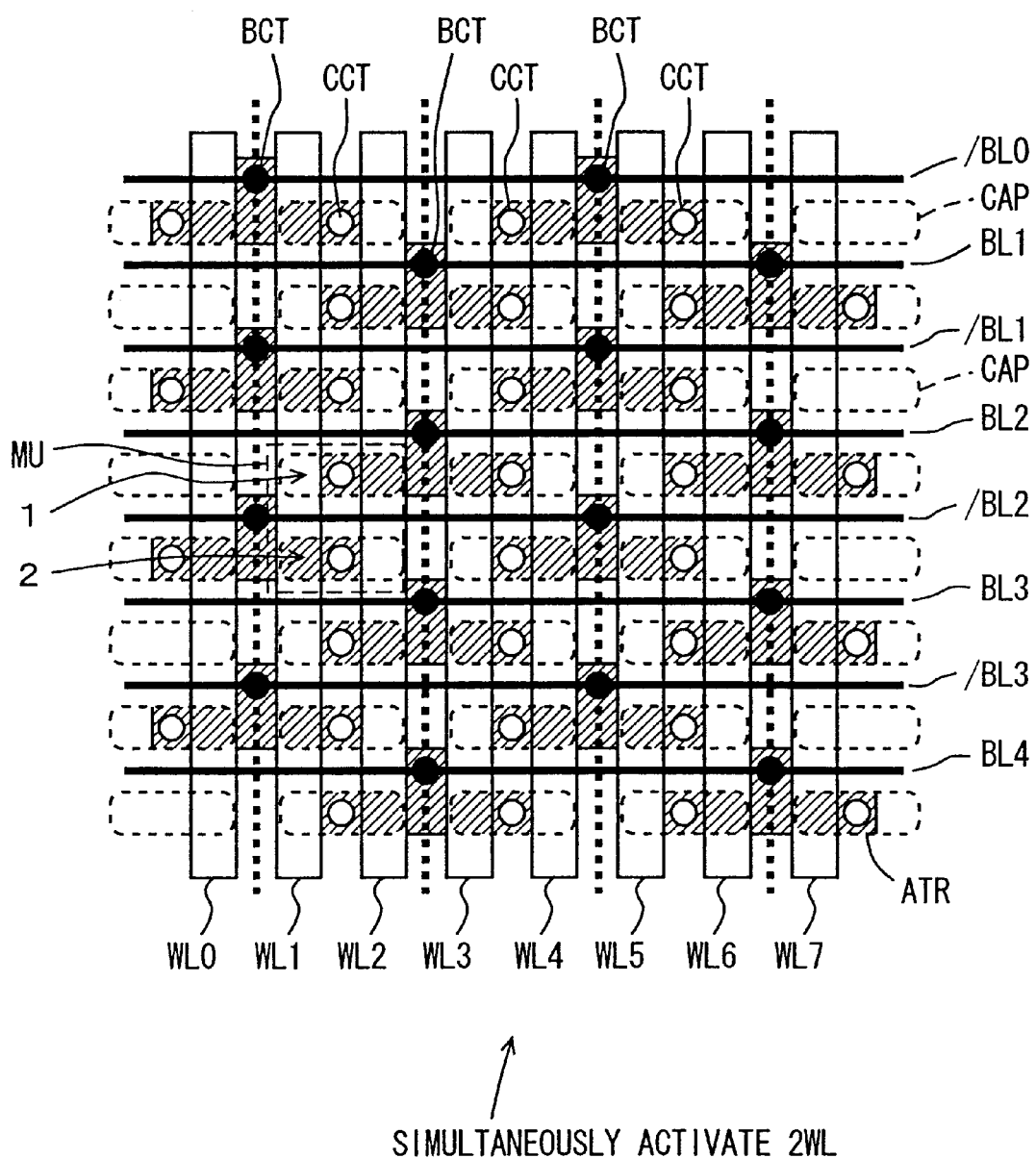
FIG. 1 is a diagram schematically showing the layout of an array portion in a semiconductor memory device according to Embodiment 1 of the present invention.

FIG. 1 is a diagram schematically showing the layout of an array portion of a semiconductor memory device according to Embodiment 1 of the present invention. In FIG. 1, reversed-T-shaped element active regions ATR are arranged in row and column directions. Element active regions ATR in adjacent columns are shifted from each other by two rows.

Bit lines BL and /BL are provided for respective columns of the element active regions. FIG. 1 representatively shows bit lines /BL0, BL1, /BL1, ... BL3, /BL3 and BL4. Each of bit lines BL1 to BL4 and /BL0 to /BL3 is coupled to element active region ATR of the corresponding column through a respective bit line contact BCT.

Memory cell capacitors CAP are provided on each element active region ATR so as to be opposite to each other with respect to a bit line contact BCT. These memory cell capacitors CAP are arranged being aligned in the row and column directions. Each memory cell capacitor CAP is coupled to the corresponding element active region ATR through a respective capacitor contact CCT. Like memory cell capacitors CAP, capacitor contacts CCT are also aligned in the row and column directions. Capacitor contact CCT is formed every three rows in the column direction, while being formed in every column in the row direction.

Bit line contact BCT is formed every five rows in the column direction, while being formed every three columns in the row direction, corresponding to the arrangement of element active regions ATR. Bit line contacts BCT and capacitor contacts CCT are displaced from each other in the row direction. Bit line contacts BCT that are located opposite to each other with respect to a corresponding capacitor contact CCT make a pair, and each pair is included in a respective memory cell unit MU described later.

Word lines WL0 to WL7 extending in the row direction are provided adjacent to capacitor contacts CCT to the memory cell capacitors CAP. Bit line contacts BCT or capacitor contacts CCT are interposed between adjacent word lines of word lines WL0 to WL7.

Each memory cell unit MU includes a first storage element 1 connected to a corresponding bit line BL and a second storage element 2 connected to a corresponding bit line /BL. FIG. 1 representatively shows storage elements 1 and 2 respectively connected to bit lines BL2 and /BL2. First and second storage elements 1 and 2 include respective memory cell capacitors CAP that are arranged in adjacent columns. The respective bit line contacts BCT of first and second storage elements 1 and 2 in memory cell unit MU are located opposite to each other with capacitor contact CCT of first memory element 1 interposed therebetween. More specifically, these opposite bit line contacts BCT are displaced from each other by one column with two word lines interposed therebetween. Regarding word lines WL0 to WL7, the word lines sandwiching the corresponding capacitor contacts CCT therebetween make a word-line set, and the word lines of each set are simultaneously driven into the selected state.

For example, in the case where word lines WL1 and WL2 are simultaneously selected, the data stored in first storage element 1 of memory cell unit MU is transmitted onto bit line BL2, whereas the data stored in second storage element 2 thereof is transmitted onto bit line /BL2. Regarding the other bit lines, the memory cell data is similarly transmitted onto the corresponding bit lines BL and /BL. Bit lines BL and /BL are provided in pairs, and a voltage between each bit line pair is differentially amplified by sense amplifier circuitry. Thus, complementary data is always stored in first and second storage element 1 and 2 of each memory cell unit MU.

Figure 30:
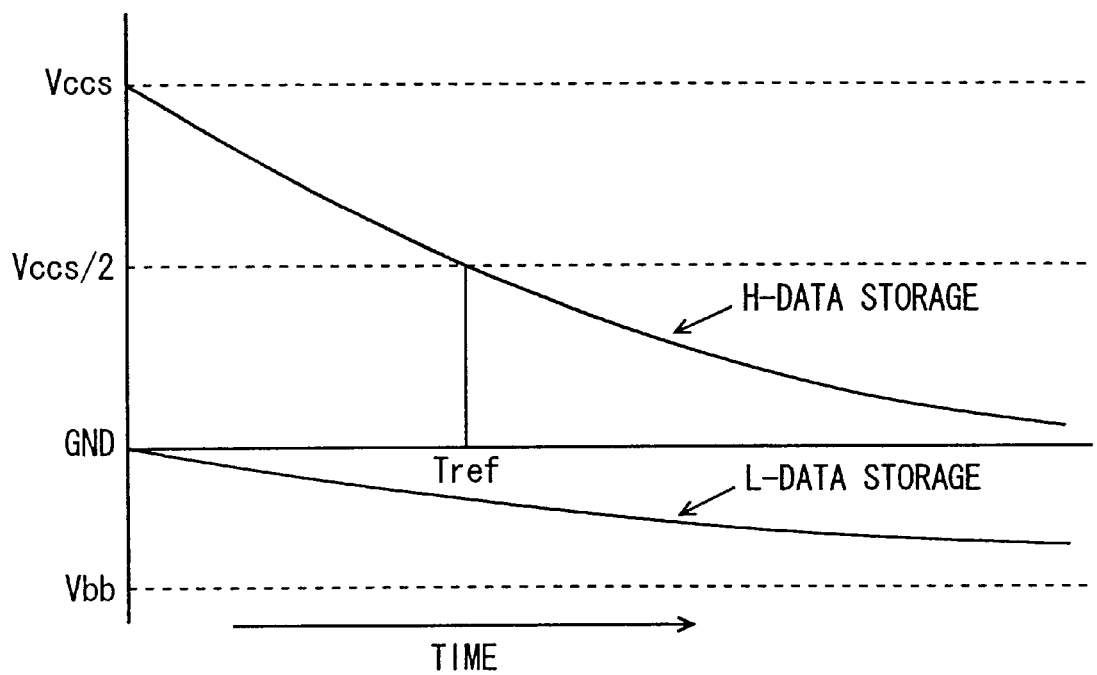
FIG. 30 is a diagram schematically showing data-holding characteristics of the structure shown in FIG. 27.
Figure 31:
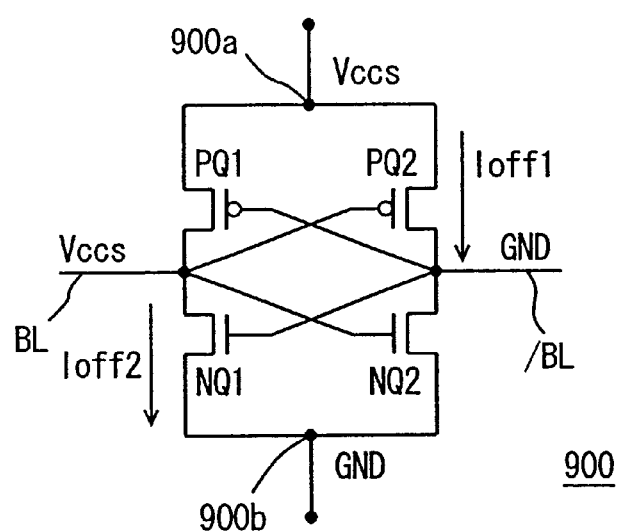
FIG. 31 is a diagram showing a leak current path in a sense amplifier circuit shown in FIG. 27.

Therefore, when memory cell unit MU is in the selected state, the voltage difference between the corresponding bit lines BL and /BL is $2 \cdot \Delta V$. Thus, the voltage difference twice that in the conventional one-cell/one-bit structure can be produced at the bit line pair. Therefore, even if a voltage levels at a storage node falls over a long period of time due to the junction leak current, a voltage difference between the bit lines can be maintained at an approximately constant voltage level over a long period of time. This is because the respective voltages at the storage nodes storing complementary data are both reduced as shown in FIG. 30. As a result, time period Tref can be increased equivalently. In other words, by using this two-cell/bit memory cell unit, the refresh time period is increased. Moreover, for reducing a power supply voltage, the sensing operation is performed with the bit-line precharge voltage being at the sense power supply voltage Vccs level. Now, an operation of Embodiment 1 is specifically described.

Figure 2:
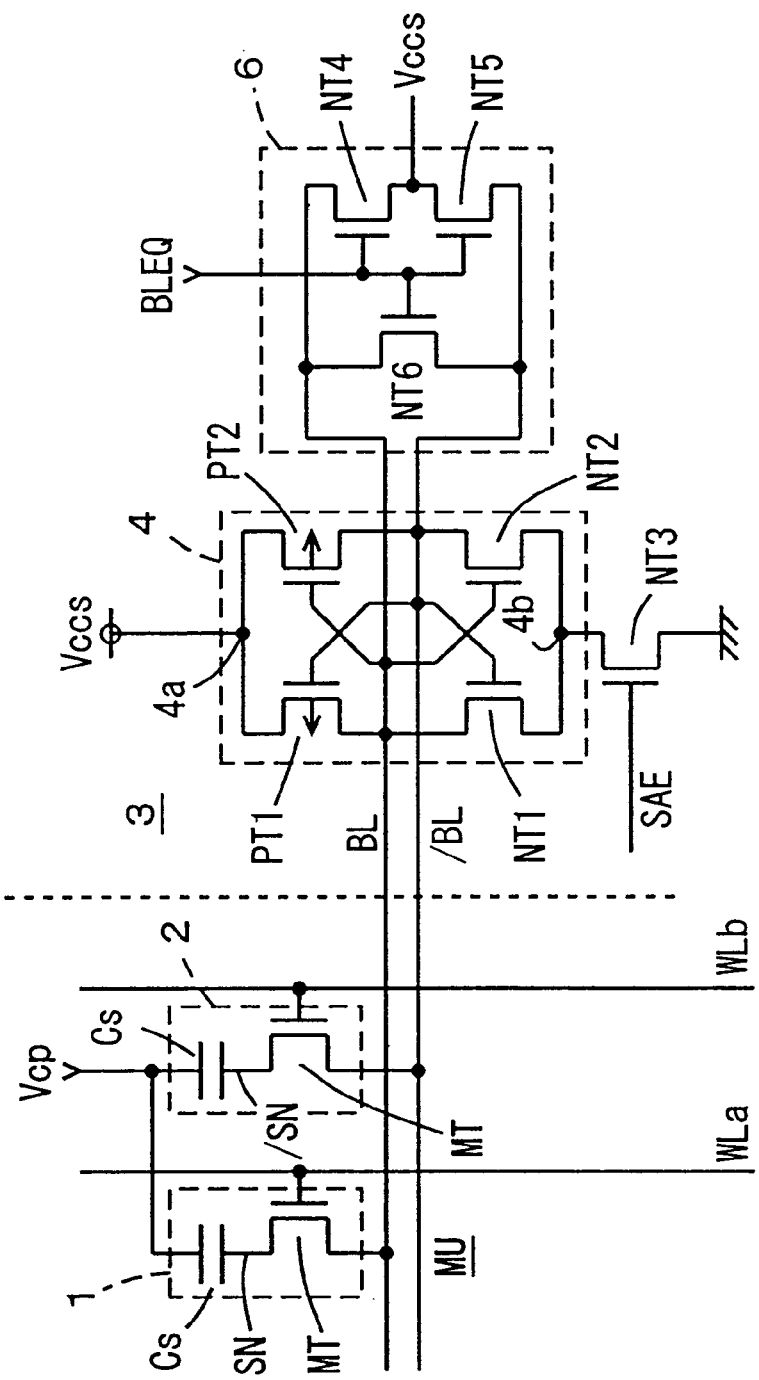
FIG. 2 is a diagram schematically showing the structure of a main part of the semiconductor memory device according to Embodiment 1.

FIG. 2 is a diagram showing the structure of an equivalent circuit of the memory cell unit, a sense amplifier circuit and a bit-line precharging/equalizing circuit according to Embodiment 1. FIG. 2 shows the structure of one memory cell unit MU and a portion associated therewith.

In FIG. 2, memory cell unit MU includes first and second storage elements 1 and 2. Each of storage elements 1 and 2 includes a memory cell capacitor Cs and an access transistor MT formed of an N-channel MOS transistor. In storage element 1, a capacitor contact of access transistor MT is coupled to a storage node SN, and a bit contact thereof is connected to bit line BL. In storage element 2, a capacitor contact of access transistor MT is coupled to a storage node /SN, and a bit line contact thereof is connected to bit line /BL. A cell-plate voltage Vcp is applied to respective electrodes (cell-plate electrodes) facing to storage nodes SN and /SN of memory cell capacitors Cs. This cell-plate voltage Vcp is an intermediate voltage Vccs/2.

A sense amplifier circuit 3 and a bit-line precharging/equalizing circuit 6 are provided for bit lines BL and /BL.

Sense amplifier circuit 3 includes a sense amplifier 4 activated to differentially amplify a voltage on bit lines BL and /BL, and a sense activation transistor NT3 for activating sense amplifier 4 in response to activation of a sense amplifier activation signal SAE. Sense activation transistor NT3 is formed by an N-channel MOS transistor.

Sense amplifier 4 includes: a P-channel MOS transistor PT1 connected between a sense power supply node 4a receiving a sense power supply voltage Vccs and bit line BL, and having its gate connected to complementary bit line /BL; a P-channel MOS transistor PT2 connected between sense power supply node 4a and bit line /BL, and having its gate connected to bit line BL; an N-channel MOS transistor NT1 connected between bit line BL and an internal node 4b, and having its gate connected to bit line /BL; and an N-channel MOS transistor NT2 connected between bit line /BL and internal node 4b, and having its gate connected to bit line BL. Sense activation transistor NT3 rendered conductive couples internal node 4b to the sense ground line.

Bit-line precharging/equalizing circuit 6 includes N-channel MOS transistors NT4 and NT5, rendered conductive in response to activation of a bit-line equalization instruction signal BLEQ, for transmitting sense power supply voltage Vccs onto bit lines BL and /BL, and an N-channel MOS transistor NT6 rendered conductive in response to activation of bit-line equalization instruction signal BLEQ for electrically short-circuiting bit lines BL and /BL. Bit-line equalization instruction signal BLEQ is at a high voltage Vpp level that is higher than sense power supply voltage Vccs. Accordingly, bit lines BL and /BL are reliably precharged and equalized to the sense power supply voltage Vccs level in the standby state.

Word lines WLa and WLb are provided for memory cell unit MU. Access transistor MT of first storage element 1 is connected to word line WLa, whereas access transistor MT of second storage element 2 is connected to word line WLb. Now, operation of the structure shown in FIG. 2 is described with reference to FIGS. 3 and 4.

Figure 3:
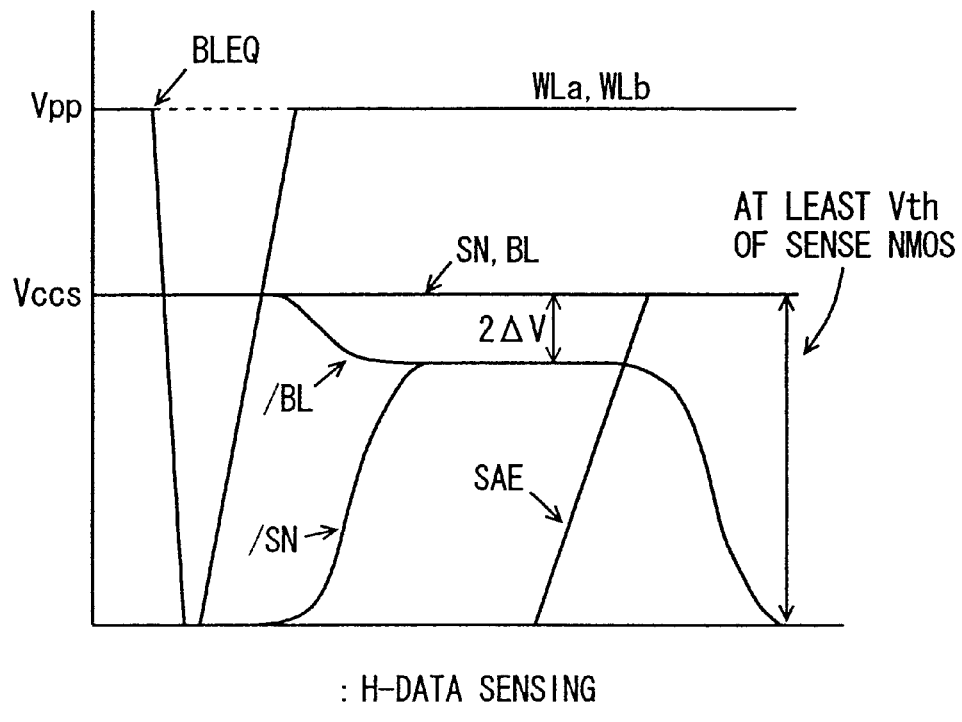
FIG. 3 is a signal waveform chart representing the H-data read operation in the structure shown in FIG. 2.
Figure 4:
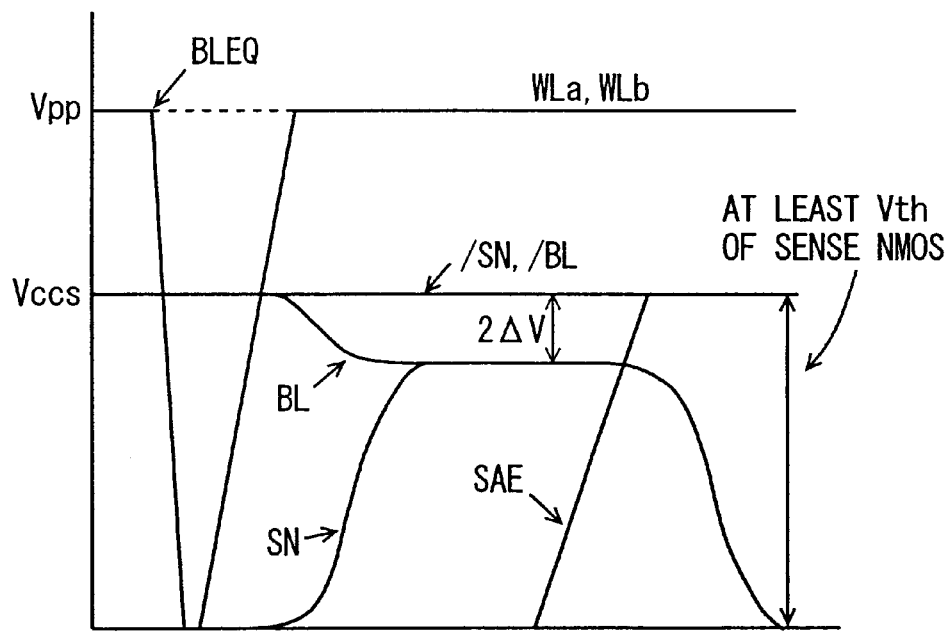
FIG. 4 is a signal waveform chart representing the L-data read operation in the structure shown in FIG. 2.

A sensing operation of H data stored in storage node SN is first described with reference to FIG. 3. In the standby state, word lines WLa and WLb are both at the L level (ground voltage level), and access transistors MT of first and second storage elements 1 and 2 are both in the OFF state. Sense amplifier activation signal SEA is also inactive at the L level, and sense activation transistor MT3 is in the OFF state.

Bit-line equalization instruction signal BLEQ is at the high voltage Vpp level. Therefore, bit-line precharging/equalizing circuit 6 is activated, whereby sense power supply voltage Vccs is transmitted through MOS transistors NT4 and NT5 onto bit lines BL and /BL without any loss of the threshold voltage of MOS transistors NT4 and NT5.

When an active cycle for row selection is started, bit-line equalization instruction signal BLEQ first falls from the high voltage Vpp level to the ground voltage level. As a result, bit-line precharging/equalizing circuit 6 is deactivated, whereby bit lines BL and /BL are both brought into a floating state at the sense power supply voltage Vccs level.

Then, a row-selecting operation is performed according to an address signal that is not shown. As a result, word lines WLa and WLb are both driven to the selected state, whereby the voltages on word lines WLa and WLb rise to the high-voltage Vpp level. In response to the voltage rise of word lines WLa and WLb, access transistors MT of storage elements 1 and 2 are rendered conductive, and storage nodes SN and /SN are respectively coupled to bit lines BL and /BL. Storage node SN stores H data, and storage node /SN stores L data. Since storage node SN has been retained at the sense power supply voltage Vccs level, the voltage level at the storage node SN does not change from the sense power supply voltage Vccs level even after a corresponding access transistor MT is rendered conductive. Bit line BL is also maintained at the sense power supply voltage Vccs level. However, the voltage level on bit line /BL falls due to the L-level data stored in storage node /SN. The voltage V(/BL) on bit line /BL is given by the following expression:

$$V(/BL)=(1-1/(1+Cb/Cs))\cdot Vccs.$$

As the voltage difference between bit lines BL and /BL is increased, sense amplifier activation signal SAE is activated to the sense power supply voltage Vccs level at a prescribed timing, whereby sense activation transistor NT3 is rendered conductive. In sense amplifier 4, bit line /BL is discharged to the ground voltage level by MOS transistors NT1 and NT2, whereas bit line BL is retained at the sense power supply voltage Vccs level by MOS transistors PT1 and PT2 (due to the voltage fall of bit line /BL, the gate voltage of MOS transistor PT1 is reduced, and bit line BL is coupled to sense power supply node 4a).

Upon reading the data in this memory cell unit MU, the voltage difference between bit lines BL and /BL is 2·ΔV, which is twice the conventional read voltage ΔV (=(1/(1+Cb+Cs))·Vccs/2). Therefore, the sensing operation can be performed stably. Now, an L-data sensing operation is described with reference to FIG. 4.

In this L-data sensing operation, storage node SN stores L data, and storage node /SN stores H data. This is because, in the data write operation, complementary data is always transmitted onto the bit lines BL and /BL, and stored in the first and second storage elements. The L-data sensing operation is the same as the H-data sensing operation until word lines WLa and WLb are selected. In response to the voltage rise of word lines WLa and WLb, access transistors MT of storage elements 1 and 2 are turned ON, and storage nodes SN and /SN are respectively coupled to bit lines BL and /BL. At this time, the voltage level at storage node /SN storing H data is at the sense power supply voltage Vccs level, and does not change therefrom. However, the voltage level on bit line BL falls due to the L data stored in storage node SN. The voltage V(BL) on bit line BL is given by the following expression:

$$V(BL)=(1-1/(1+Cb/Cs))\cdot Vccs.$$

In the L-data sensing operation as well, the voltage difference between bit lines BL and /BL is 2·ΔV, which is twice the conventional read voltage ΔV. Then, sense amplifier activation signal SAE is activated, whereby sense amplifier 4 is activated responsively. Thus, bit line BL is discharged to the ground voltage level by MOS transistors NT1 and NT2.

Thus, in Embodiment 1 as well, the read voltage of bit lines BL and /BL is 2·ΔV, which is twice that of the conventional example. The H data and L data are read at the same read voltage.

Figure 27:
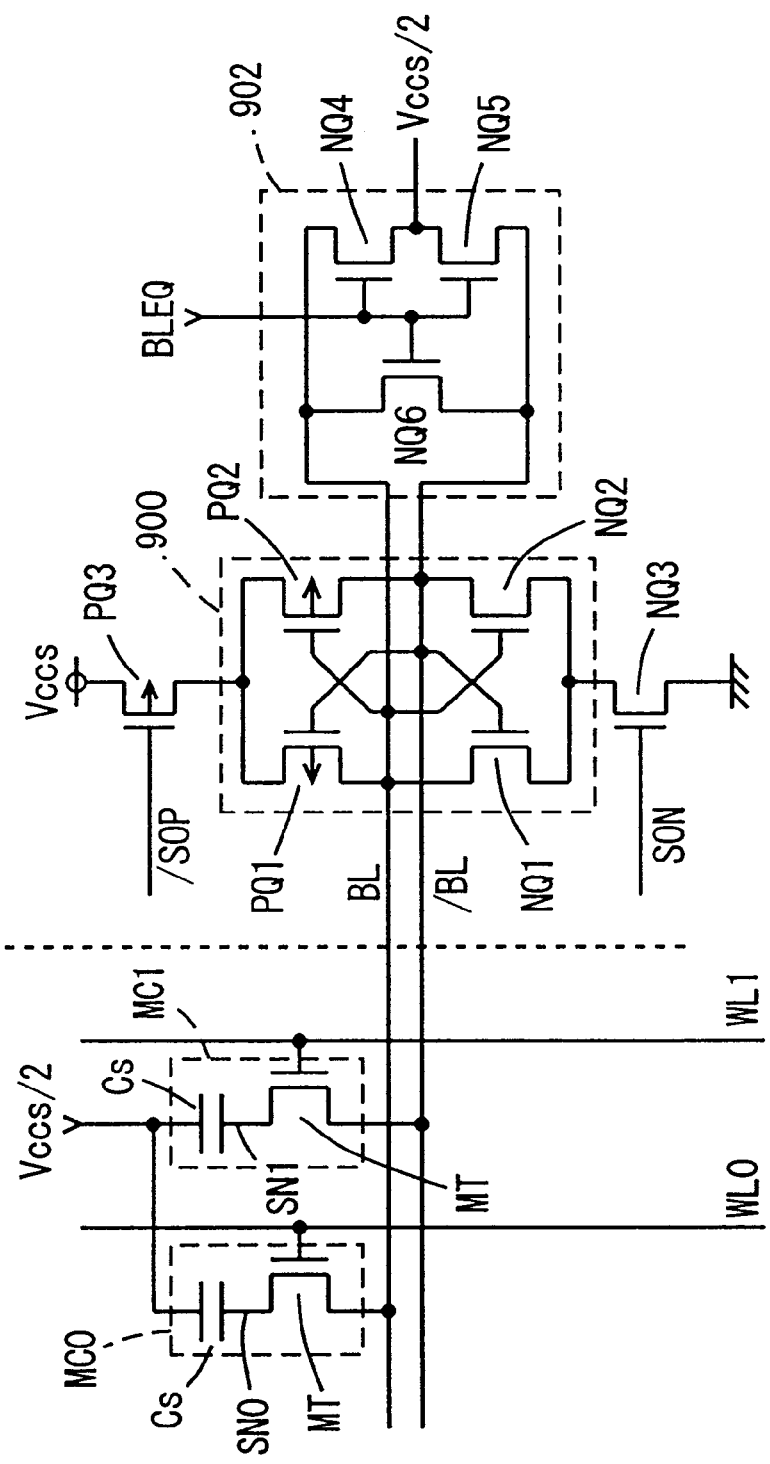
FIG. 27 is a diagram schematically showing the structure of a main part of a conventional semiconductor memory device.
Figure 28:
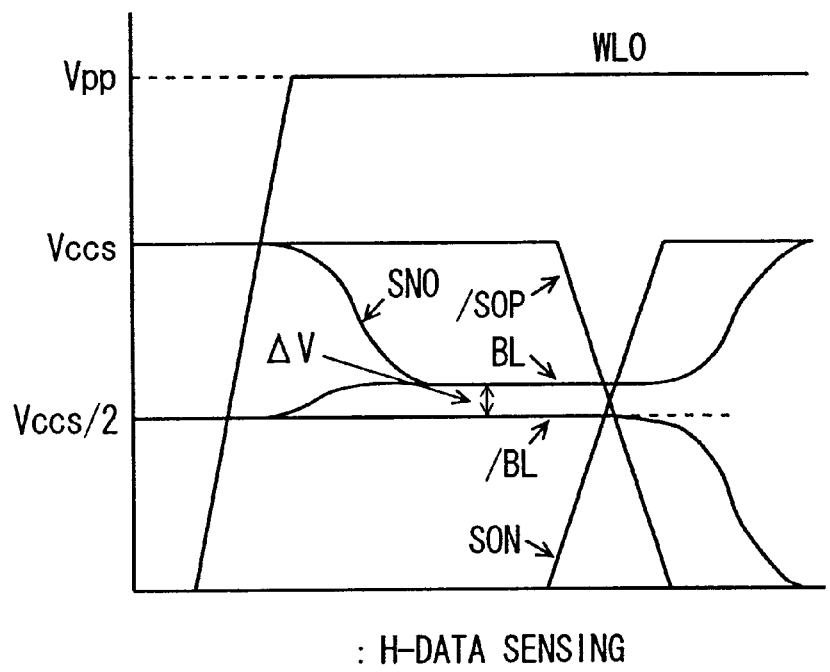
FIG. 28 is a signal waveform chart representing the H-data read operation in the structure shown in FIG. 27.
Figure 29:
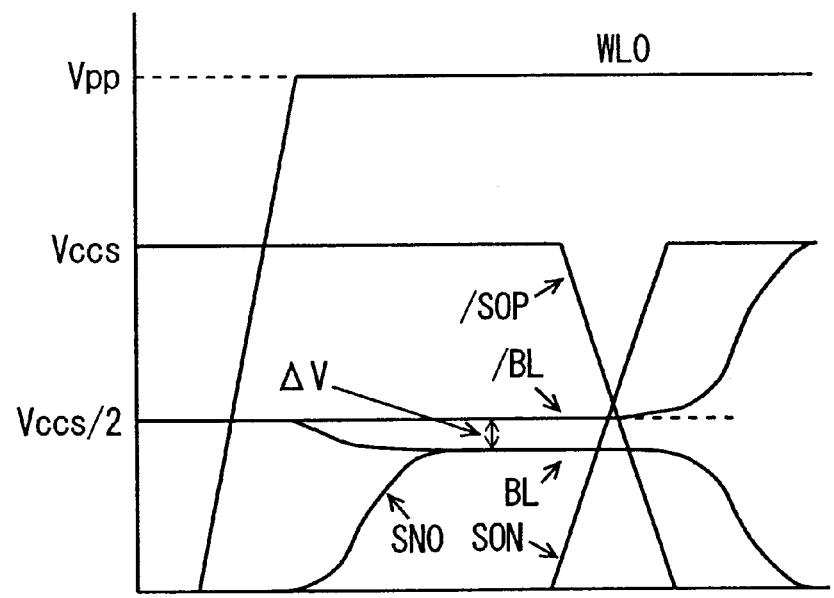
FIG. 29 is a signal waveform chart representing the L-data read operation in the structure shown in FIG. 27.

Accordingly, the read voltage is increased from ΔV (the conventional memory cell structure shown in FIG. 27) to 2·ΔV. Therefore, provided that the ratio Cb/Cs of capacitance Cb of the bit line to capacitance Cs of the memory cell capacitor is the same, the same read voltage as that of the conventional example can be obtained at half the sense power supply voltage Vccs. Thus, reduction in sense power supply voltage can be achieved. On the contrary, provided that the sense power supply voltage Vccs has the same voltage level as that of the conventional example, the same read voltage as that of the conventional example can be obtained at approximately doubled capacitance ratio Cb/Cs (usually about 5), i.e., with half the capacitance Cs of the memory cell capacitor. Thus, the capacitance of the DRAM memory cell capacitor can be reduced, and the memory cell size (storage element size) can be reduced accordingly.

Such a read voltage can be obtained from the cell-plate voltage Vcp equal to Vccs/2 through the charge conservation law.

Moreover, even if the H data has a low voltage level, the sensing operation can be correctly performed as long as the voltage difference between bit lines BL and /BL is equal to or higher than the conventional read voltage ΔV. Accordingly, the sensing operation can be normally performed even if the voltage level on word lines WLa and WLb is lower than the high voltage Vpp, such as a periphery power supply voltage Vcch (e.g., at about 1.2 V, sense-power supply voltage Vccs is 1.0 V).

Figure 5:
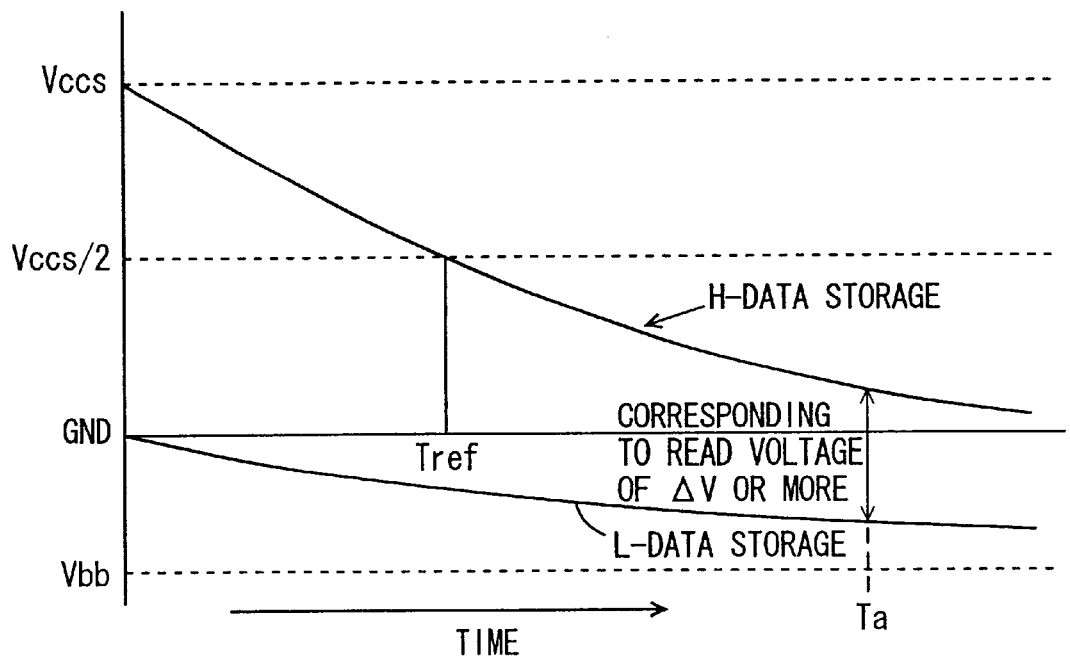
FIG. 5 is a diagram schematically showing refresh characteristics of a memory cell unit shown in FIG. 2.

As shown in FIG. 5, the voltage levels of the H-data storage node and L-data storage node both decrease due to the junction leak current. The storage node that stores the H data and the storage node that stores the L data are both coupled to the respective bit lines in memory cell unit. Therefore, the sensing operation can be accurately performed unless the voltage at the H-data storage node falls to the level lower than that of the L-data storage node. Accordingly, the refresh operation can still be performed at, for example, time Ta of FIG. 5. As a result, a substantially refresh-free DRAM can be implemented.

Herein, high voltage Vpp is typically 2.0 V to 2.7 V, and sense power supply voltage Vccs is typically 1.0 V to 1.5 V.

Accordingly, in both the H-data and L-data read operations, the respective gate voltages of N-channel transistors NT1 and NT2 in sense amplifier 4 are higher than the threshold voltage. Therefore, the sensing operation can be performed at a high speed. Moreover, even if sense power supply voltage Vccs is 1.0 V, bit lines BL and /BL have the precharge voltage at the sense power supply voltage Vccs level. Therefore, MOS transistor NT1 or NT2 in sense amplifier 4 for discharging the associated bit line has the gate voltage at the sense power supply voltage Vccs level. Therefore, the threshold voltage of MOS transistors NT1 and NT2 of sense amplifier 4 need not be reduced. As a result, the leak current Icc3 in the active standby state can be reduced.

Figure 6:
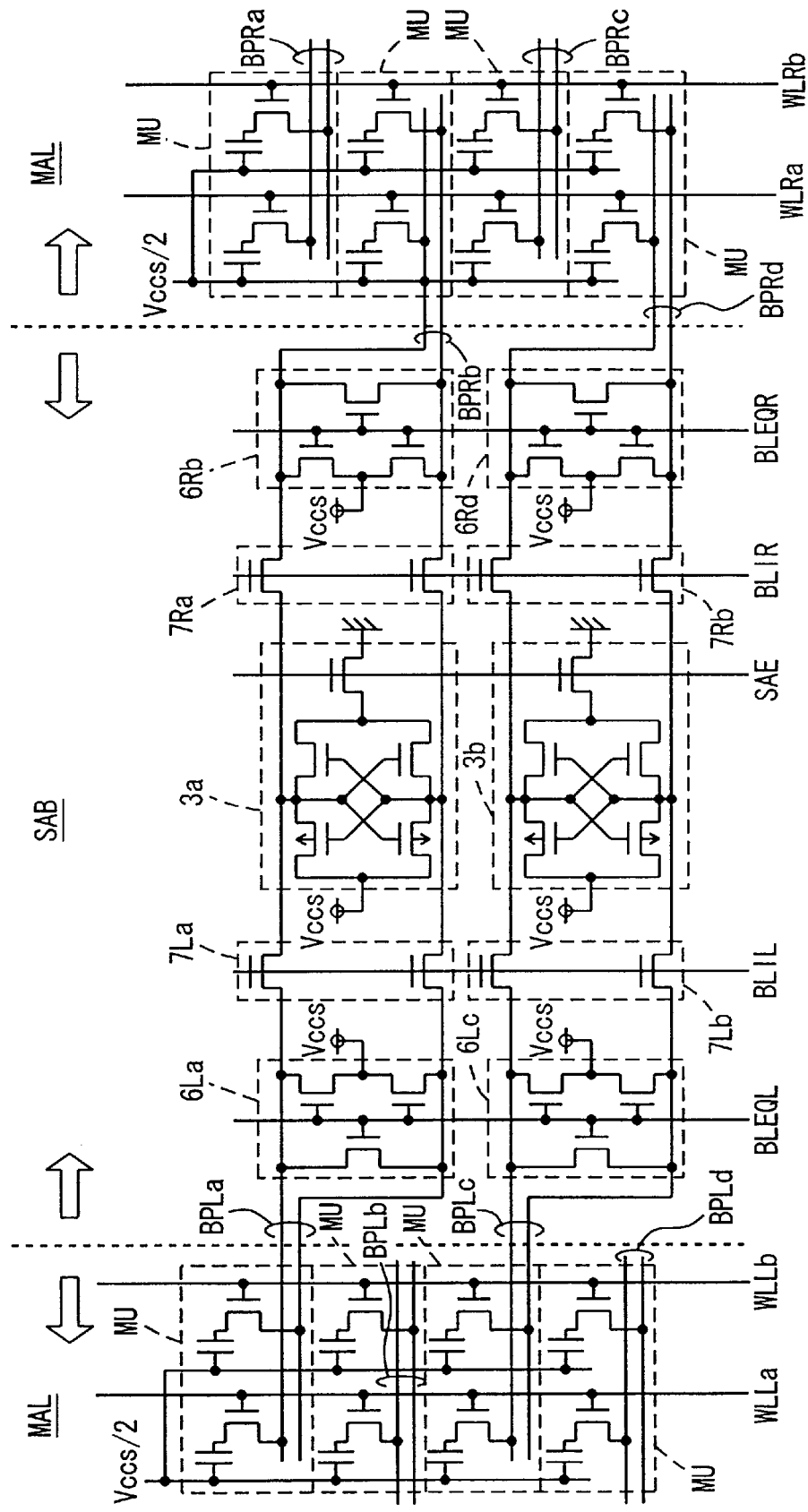
FIG. 6 is a diagram specifically showing a structure of the array portion in the semiconductor memory device according to Embodiment 1.

FIG. 6 is a diagram showing the specific structure of the array portion of the semiconductor memory device according to Embodiment 1. In FIG. 6, memory sub-arrays MAL and MAR are disposed on both sides of a sense amplifier band SAB. Bit line pairs BPLa to BPLd and word lines WLLa and WLLb are provided in memory sub-array MAL. Memory cell units MU are located at the respective intersections of bit line pairs BPLa to BPLd and word lines WLLa, WLLb.

Similarly, bit line pairs BPRa to BPRd and word lines WLRa and WLRb are provided in memory sub-array MAR. Memory cell units MU are located at the respective intersections of bit line pairs BPRa to BPRd and word lines WLRa, WLRb. In these memory sub-arrays MAL and MAR, memory cell units MU are arranged in a matrix of rows and columns. FIG. 6 representatively shows memory units MU that are arranged in one row and four columns in each of memory sub-arrays MAL and MAR.

In sense amplifier band SAB, bit-line precharging/equalizing circuits 6La and 6Lc are provided for bit line pairs BPLa and BPLc, respectively, and bit-line precharging/equalizing circuits 6Rb and 6Rd are provided for bit line pairs BPRb and BPRd, respectively. Similarly, a bit-line precharging/equalizing circuit is provided at the other end (not shown) of each of bit line pair BPLa and BPLc, and also at the other end (not shown) of each of bit line pair BPRa and BPRc.

Bit-line precharging/equalizing circuits 6La and 6Lc are activated in response to a bit-line equalization instruction signal BLEQL, and bit-line precharging/equalizing circuits 6Rb and 6Rd are activated in response to a bit-line equalization instruction signal BLEQR. These bit-line precharging/equalizing circuits 6La, 6Lc, 6Rb and 6Rd, when activated, transmit sense power supply voltage Vccs to each bit line of the respective bit line pairs.

Bit-line precharging/equalizing circuits 6La and 6Lc are coupled to sense amplifier circuits 3a and 3b through bit-line isolation gates 7La and 7Lb, respectively. Similarly, bit-line precharging/equalizing circuits 6Rb and 6Rd are coupled to sense amplifier circuits 3a and 3b through bit-line isolation gates 7Ra and 7Rb, respectively. Bit-line isolation gates 7La and 7Lb are rendered conductive in response to a bit-line isolation instruction signal BLIL, and bit-line isolation gates 7Ra and 7Rb are rendered conductive in response to a bit-line isolation instruction signal BLIR.

Each of sense amplifier circuits 3a and 3b has the same structure as that of sense amplifier circuit shown in FIG. 2, and differentially amplifies a voltage on the corresponding bit line pair in response to activation of a sense amplifier activation signal SAE.

According to the arrangement of the sense amplifier circuitry shown in FIG. 6, sense amplifier circuitry 3 (3a, 3b) is shared by memory sub-arrays MAL and MAR, and a single sense amplifier circuit is provided for two bit line pairs. The sense amplifier circuits are alternately arranged in the sense amplifier bands (not shown) located on both sides of each memory sub-array. Therefore, even if memory sub-arrays MAL and MAR have a reduced bit-line pitch, the sense amplifier circuits can be arranged with a sufficient margin.

Moreover, in the structure of FIG. 6, bit line pairs BPLa and BPLc of memory sub-array MAL share sense amplifier circuits 3a and 3b with bit line pairs BPRb and BPRd of memory sub-array MAR, respectively. Therefore, between sub-arrays MAL and MAR, the bit line pairs sharing the sense amplifier circuit are displaced from each other by one column. However, in the column-selecting operation, sense amplifier circuit 3a or 3b is coupled to an internal data line through a column-selection gate located near sense amplifier circuit 3a, 3b. Accordingly, even if the corresponding bit line pairs are displaced from each other in memory sub-arrays MAL and MAR and bit line pairs to be selected by the same column selection signal are located at different positions in memory sub-arrays MAL and MAR, data is written through the bit line pairs located at such different positions, and is also read through the same bit line pairs. This is externally the same as accessing the memory cells located at the same positions. Therefore, such a structure does not cause any disadvantage.

In terms of the layout, according to the structure in which the sense amplifier circuitry is shared between the bit line pairs of memory sub-arrays MAL and MAR that are displaced from each other by one column, the total bit-line length (the total length of the bit lines constituting the bit line pairs BPLa and BPRb) can be equalized by providing the bit-line peripheral circuitry (such as the sense amplifier circuit and bit-line equalizing circuit) corresponding to two bit line pairs. This is because the shared sense amplifier structure is considered to be a so-called divided-bit-line structure). Moreover, the same layout of the sense amplifier circuitry can be realized regardless of the position of the sense amplifier circuitry (the position of the sense amplifier band). The sense amplifier circuitry need not be shifted by one column depending on the position of the sense amplifier band.

In the arrangement of FIG. 6, sense amplifier circuitry 3 (3a, 3b, . . . ) of sense amplifier band SAB may be shared by the bit line pairs located in the same position in memory sub-arrays MAL and MAR.

Figure 7:
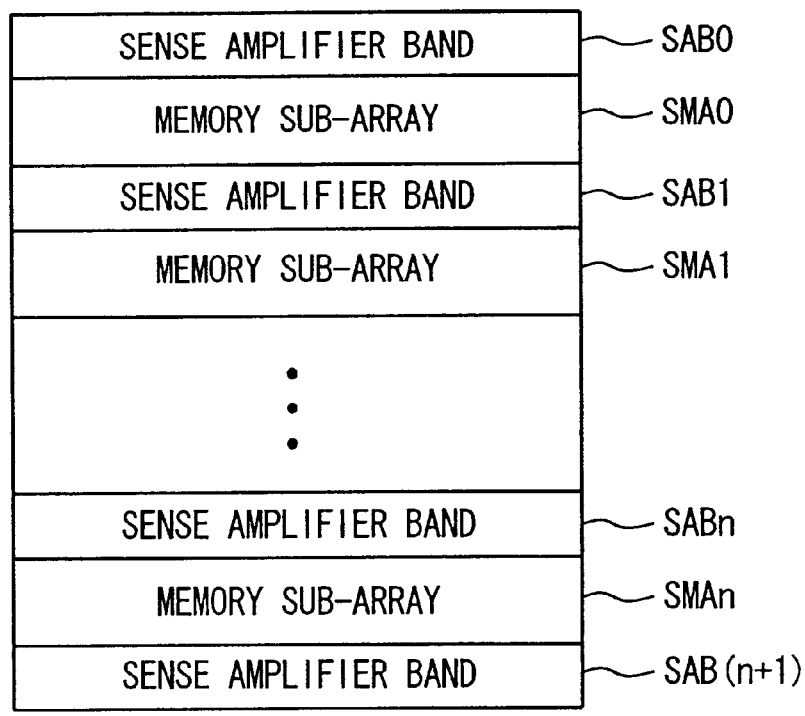
FIG. 7 is a diagram schematically showing an overall structure of the array portion in the semiconductor memory device according to Embodiment 1.

FIG. 7 is a diagram schematically showing the overall structure of a memory array. In FIG. 7, the memory array is divided into a plurality of memory sub-arrays SMA0 to SMAn in the column direction. Sense amplifier bands SAB1 to SABn are located between memory sub-arrays SMA0 to SMAn, and sense amplifier bands SAB0 and SAB(n+1) are located outside memory sub-arrays SMA0 and SMAn, respectively. Each of sense amplifier bands SAB1 to SABn is shared by the corresponding memory sub-arrays that are adjacent to each other in the column direction.

Figure 8:
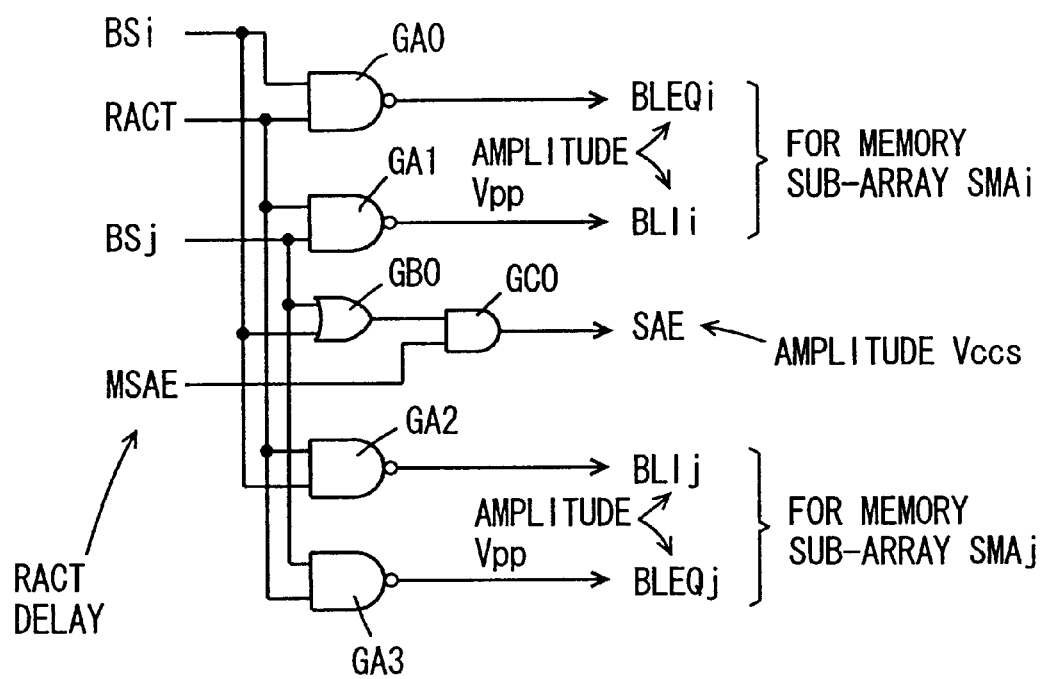
FIG. 8 is a diagram showing one example of the structure of a row control circuit in the semiconductor memory device according to Embodiment 1.

FIG. 8 is a diagram schematically showing the structure of a row control circuit that is provided corresponding to one sense amplifier band. In FIG. 8, the row control circuit includes: a NAND circuit GA0 receiving a block selection signal BSi specifying a memory sub-array SMAi and a row activation signal RACT, for producing a bit-line equalization instruction signal BLEQi; a NAND circuit GA1 receiving the row activation signal RACT and a block selection signal BSj specifying a memory sub-array SAMj, for producing a bit-line isolation instruction signal BLIi; an OR circuit GB0 receiving the block selection signals BSi and BSj; an AND circuit GC0 receiving an output signal of OR circuit GB0 and a main sense amplifier activation signal MSAE, for producing a sense amplifier activation signal SAE; a NAND circuit GA2 receiving the block selection signal BSi and row activation signal RACT, for producing a bit-line isolation instruction signal BLIj; and a NAND circuit GA3 receiving the block selection signal BSj and row activation signal RACT, for producing a bit-line equalization instruction signal BLEQj.

The bit-line isolation instruction signal BLIi and bit-line equalization instruction signal BLEQi are applied to the bit-line isolation gates and bit-line precharging/equalizing circuitry that are provided for memory sub-array SMAi. The bit-line isolation instruction signal BLIj and bit-line equalization instruction signal BLEQj are applied to the bit-line isolation gates and bit-line precharging/equalizing circuitry that are provided for memory sub-array SMAj.

In the structure of the row control circuitry shown in FIG. 8, when memory sub-array SMAi is selected, block selection signal BSi is activated at the H level, whereas block selection signal BSj is retained at the L level. Accordingly, bit-line isolation instruction signal BLIj falls to the L level in response to activation of row activation signal RACT, whereby memory sub-array SMAj is isolated from the corresponding sense amplifier circuitry. Since block selection signal BSj is at the L level, bit-line equalization instruction signal BLEQj is retained at the H level, and memory sub-array SMAj is maintained in a precharged state. Bit-line equalization instruction signal BLEQi falls to the L level in response to activation of row activation signal RACT, whereby precharging of the bit lines in memory sub-array SMAi is completed. Then, sense amplifier activation signal SAE is activated in response to activation of main sense amplifier activation signal MSAE, whereby the sensing operation for the bit line pairs in memory sub-array SMAi is performed.

When block selection signal BSj is selected, bit-line equalization instruction signal BLEQi of memory sub-array SMAj falls to the L level, and bit-line isolation instruction signal BLIj is retained at the H level. Memory sub-array SMAi is isolated from the corresponding sense amplifier circuitry, and is maintained in the precharged state.

In the structure of FIG. 8, NAND circuits GA0 to GA3 have a level-converting function of converting a control signal at a power supply voltage (periphery power supply voltage level) into a signal at a high-voltage Vpp level to produce the bit-line equalization instruction signal and bit-line isolation instruction signal. Sense amplifier activation signal SAE rises to the H level of the sense power supply voltage Vccs level or periphery power supply voltage Vccs level when activated.

Note that main sense amplifier activation signal MSAE is produced by delaying row activation signal RACT. For example, row activation signal RACT is activated when a row access command for instructing row selection is applied.

Figure 9:
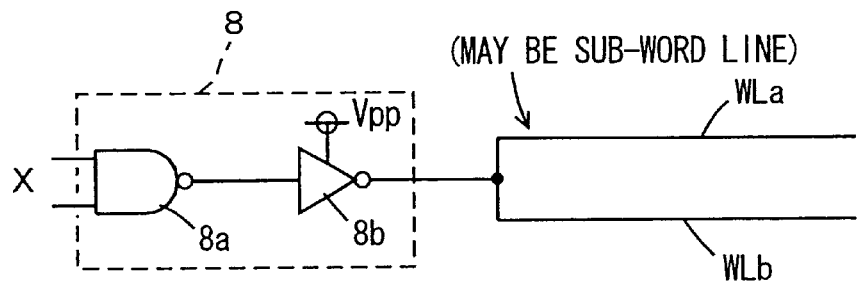
FIG. 9 is a diagram showing the structure of a row selection circuit in the semiconductor memory device according to Embodiment 1.

FIG. 9 is a diagram showing one example of the structure of a row selection circuit. FIG. 9 representatively shows a row selection circuit 8 provided for word lines WLa and WLb. Word lines WLa and WLb receive in common a word-line selection signal from row selection circuit 8. These word lines WLa and WLb are connected to each other through interconnection line so as to commonly receive the row selection signal from row selection circuit 8.

Row selection circuit 8 includes a NAND-type decode circuit 8a for performing a decode operation on received pre-decode signals X, and an inverter circuit 8b having a level-converting function of converting the level of an output signal of NAND-type decode circuit 8a to produce the word-line selection signal onto word lines WLa and WLb.

Pre-decode signals X are produced by decoding an address signal by a pre-decoder (not shown). When a prescribed combination of pre-decode signals X is applied, NAND-type decode circuit 8a outputs a signal at the L level, and responsively inverter circuit 8b having level-converting function outputs a row selection signal at the high-voltage Vpp level.

Note that, in FIG. 9, inverter circuit 8b having level-converting function is used to produce the row selection signal at the high-voltage Vpp level. However, the periphery power supply voltage Vcch may be used instead of the high voltage Vpp. Even when the H data falls to the level lower than sense power supply voltage Vccs due to the threshold voltage of the access transistor, a sense amplifier pulling-up P-channel MOS transistor restores the H data to the sense power supply voltage Vccs level. Thus, even if the read voltage is reduced in the sensing operation, the read voltage is sufficiently larger than that of the conventional one-cell/one-bit structure. Therefore, the sensing operation can be performed stably.

The word lines may alternatively have a hierarchical structure of main word lines and sub word lines. In the hierarchical arrangement of the word lines, two sub word lines are simultaneously selected. In this case, a sub-word-line driver is provided instead of the decoder shown in FIG. 9, so that two sub word lines are driven simultaneously with a single sub-word-line driver.

As has been described above, according to Embodiment 1, 1-bit data is stored with two storage elements, and complementary data are read onto complementary bit lines. Moreover, the bit line pairs are precharged to the sense power supply voltage level. Therefore, a large read voltage can be produced on the bit lines, and the sensing operation can be stably performed even under a low power supply voltage. Moreover, since the bit line pairs are precharged to the sense power supply level, the sensing operation can be sufficiently stably performed even when a MOS transistor having a high threshold voltage is used for the sense amplifier circuitry, and the sensing operation can be accurately performed even under the low power supply voltage. By using the MOS transistor having a high threshold voltage, the active-standby leak current Icc3 in the sense amplifier circuitry can be reduced, whereby reduction in current consumption can be achieved.

[Embodiment 2]

Figure 10:
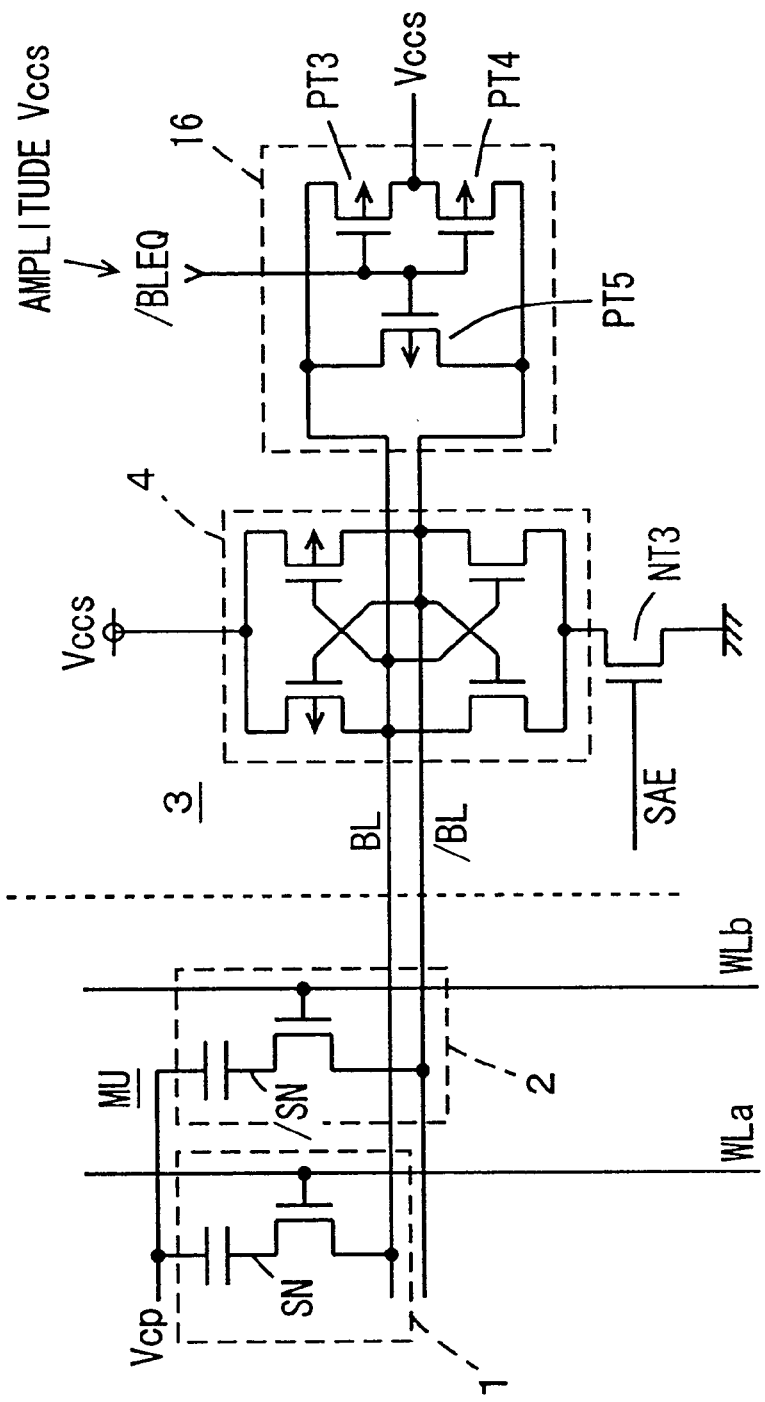
FIG. 10 is a diagram schematically showing the structure of a main part of a semiconductor memory device according to Embodiment 2 of the present invention.

FIG. 10 is a diagram showing the structure of a main part of a semiconductor memory device according to Embodiment 2 of the present invention. FIG. 10 shows the structure of a portion associated with one memory unit MU. Like Embodiment 1, memory unit MU includes storage elements 1 and 2 each having an access transistor and a capacitor. A sense amplifier circuit 3 is provided for bit lines BL and /BL. Similarly to Embodiment 1, sense amplifier circuit 3 includes: a sense amplifier 4 including cross-coupled P-channel MOS transistors and cross-coupled N-channel MOS transistors; and a sense amplifier activation transistor NT3 for activating sense amplifier 4 in response to activation of a sense amplifier activation signal SAE.

A bit-line precharging/equalizing circuit 16 is provided in order to precharge bit lines BL and /BL to the sense power supply voltage Vccs level in the standby cycle. Bit-line precharging/equalizing circuit 16 includes: P-channel MOS transistors PT3 and PT4 rendered conductive in response to a bit-line equalization instruction signal /BLEQ at the L level, for transmitting sense power supply voltage Vccs onto bit lines BL and /BL; and a P-channel MOS transistor PT5 rendered conductive in response to bit-line equalization instruction signal /BLEQ at the L level, for electrically short-circuiting bit lines BL and /BL. Bit-line equalization instruction signal /BLEQ is at the H level at the sense power supply voltage level Vccs, and has an amplitude Vccs.

In the structure of FIG. 10, a circuit formed by P-channel MOS transistors is used as the bit-line precharging/equalizing circuit in order to transmit sense power supply voltage Vccs onto bit lines BL and /BL. Note that, in Embodiment 2 as well, sense amplifier circuit 3 has an alternately arranged, shared sense amplifier structure, and equalizing circuit 16 is coupled to sense amplifier 3 through a bit-line isolation gate not shown.

Figure 11:
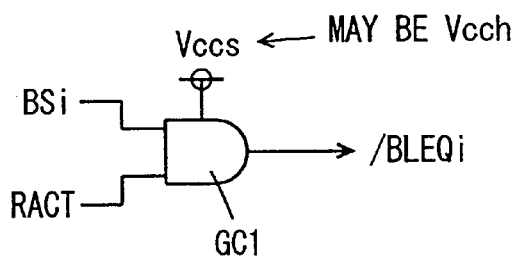
FIG. 11 is a diagram showing one example of the structure of a portion for generating a bit-line equalization instruction signal as shown in FIG. 10.

FIG. 11 is a diagram showing one example of the structure of a portion for generating the bit-line equalization instruction signal. In FIG. 11, a bit-line equalization instruction signal /BLEQi is produced by an AND circuit GC1 that receives a block selection signal BSi and a row activation signal RACT. AND circuit GC1 receives a sense power supply voltage Vccs as one operating power supply voltage. Block selection signal BSi specifies a memory sub-array having bit-line precharging/equalizing circuit 16, and rises to the H level when selected. It should be noted that AND circuit GC1 may receive a periphery power supply voltage Vcch as one operating power supply voltage. Now, operation of the structure shown in FIG. 10 is described with reference to FIGS. 12 and 13.

Figure 12:
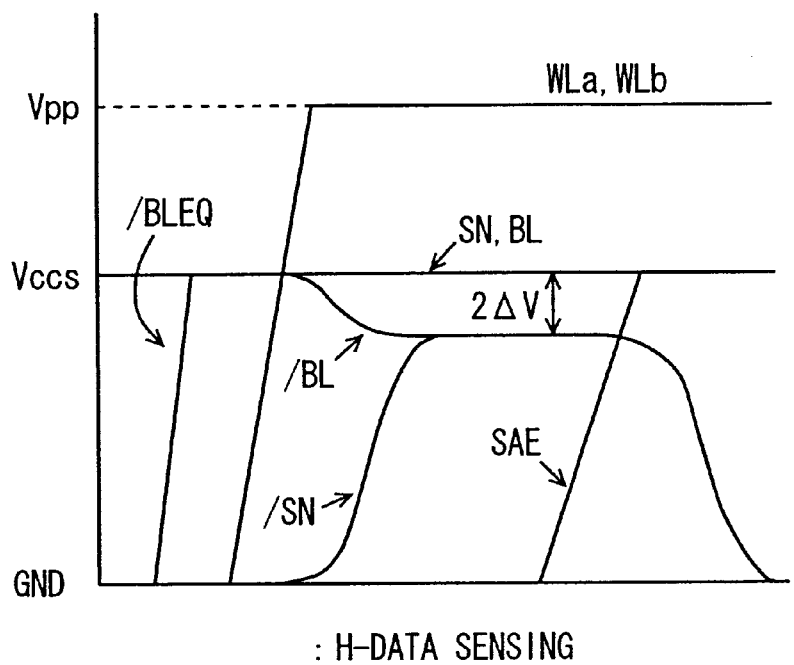
FIG. 12 is a signal waveform chart representing the H-data read operation in the structure shown in FIG. 10.

Referring first to FIG. 12, an H-data read operation is described briefly. In the standby state, bit-line equalization instruction signal /BLEQ is at the L level. In bit-line precharging/equalizing circuit 16, MOS transistors PT3 to PT5 are in ON state, and bit lines BL and /BL are precharged and equalized to the sense power supply voltage Vccs level.

When an active cycle is started (row activation signal RACT is activated), bit-line equalization instruction signal /BLEQ rises to the H level at the sense power supply voltage level Vccs. Thus, bit-line precharging/equalizing circuit 16 is deactivated, and bit lines BL and /BL are brought into a floating state at the sense power supply voltage Vccs level. Then, a row selection operation is performed, and a voltage on word lines WLa and WLb rises up to the high voltage Vpp level. Upon reading the H-data, storage node SN of storage element 1 is at the H level, whereas storage node /SN of storage element 2 is at the L level. Like Embodiment 1, in response to the voltage rise of word lines WLa and WLb, bit line BL is maintained at the sense power supply voltage Vccs level, whereas the voltage levels on bit line /BL and storage node /SN become equal to each other due to the charge transfer. As a result, a read voltage, 2·ΔV appears on bit line /BL. Then, sense amplifier activation signal SAE is activated, whereby sense amplifier circuit 3 performs the sensing operation.

Since bit-line equalization instruction signal /BLEQ has an amplitude of the sense power supply voltage Vccs level, current consumption required for the equalizing operation can be reduced.

Figure 13:
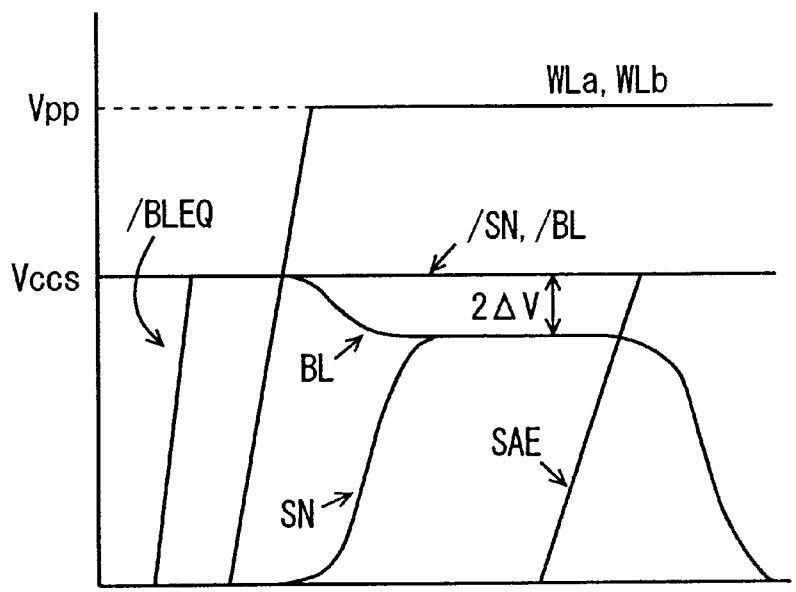
FIG. 13 is a signal waveform chart representing the L-data read operation in the structure shown in FIG. 10.

FIG. 13 is a waveform diagram in an L-data read operation. The L-data reading operation is the same as the H-data read operation from the standby state until word-line selection. Upon reading the L-data, storage node /SN is at the sense power supply voltage Vccs level, and storage node SN is at the ground voltage level. The voltage levels on bit line BL and storage node SN become equal to each other. Like Embodiment 1, a read voltage 2·ΔV appears on bit line BL. Then, sense amplifier activation signal SAE is activated, whereby sense amplifier circuit 3 performs the sensing operation. Thus, the H-data and L-data read operations are the same as those of Embodiment 1. Since bit-line equalization instruction signal /BLEQ has a reduced amplitude, a charging current for driving the bit-line precharging/equalizing circuit can be reduced, whereby reduction in current consumption can be achieved.

It should be noted that, as shown in FIG. 11, in the case where the periphery power supply voltage Vcch is used as an operating power supply voltage of AND circuit GC1, bit-line equalization instruction signal /BLEQ has an amplitude of the periphery power supply voltage Vcch level. In either case, the high voltage Vpp need not be used for the bit-line equalizing/precharging control, whereby a load of charge pumping for generating the high voltage Vpp is reduced, and reduction in current consumption is achieved. Here, high voltage Vpp is generally produced by a charge pumping operation that has charge-utilizing efficiency of less than 1 and therefore, consumes a large amount of current to generate the high voltage.

[Embodiment 3]

Figure 14:
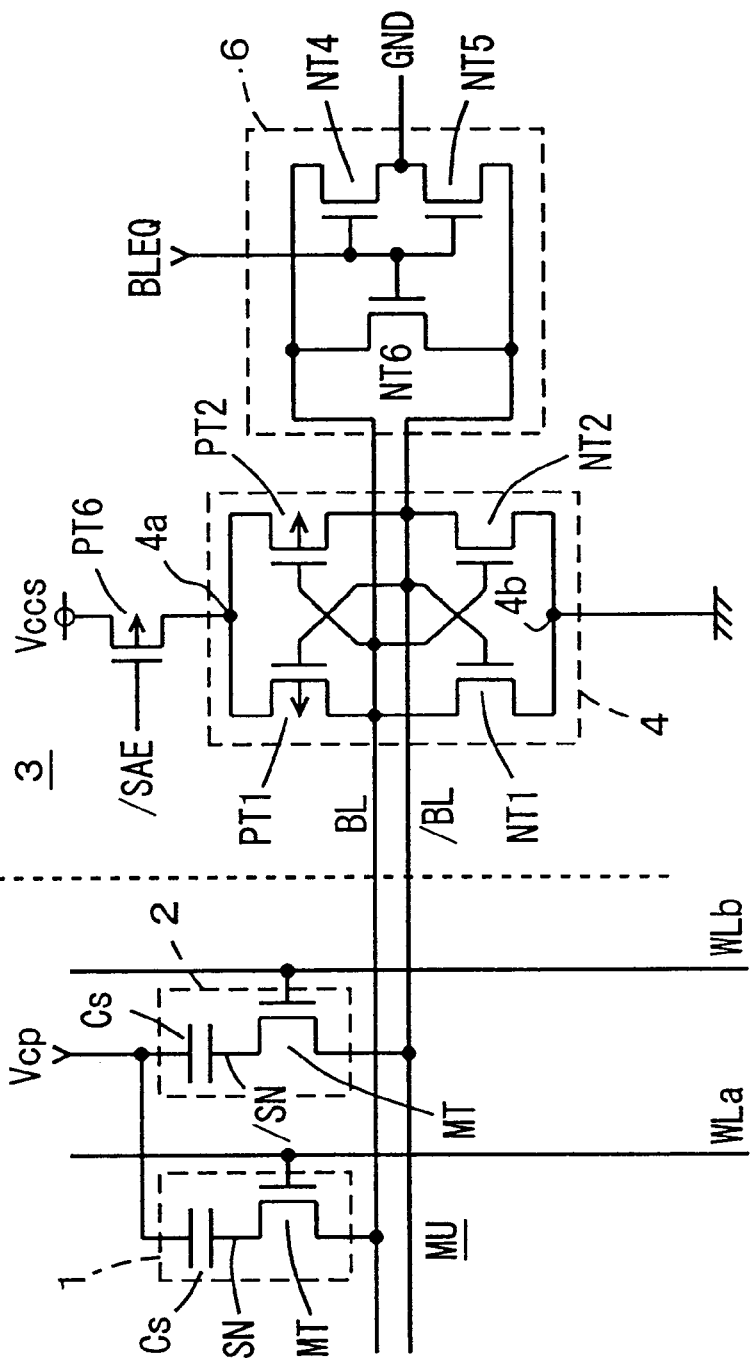
FIG. 14 is a diagram schematically showing the structure of a main part of a semiconductor memory device according to Embodiment 3 of the present invention.

FIG. 14 is a diagram schematically showing the structure of a main part of a semiconductor memory device according to Embodiment 3 of the present invention. FIG. 14 shows the structure of a portion associated with one memory cell unit MU. In the structure of FIG. 14, bit-line precharging/equalizing circuit 6 transmits ground voltage GND onto bit lines BL and /BL instead of sense power supply voltage Vccs.

Bit lines BL and /BL are precharged to the ground voltage GND level. Therefore, in sense amplifier circuit 3, sense power supply node 4a of sense amplifier 4 is coupled to the sense power supply line through a sense amplifier activation transistor PT6 that is rendered conductive in response to a sense amplifier activation signal /SAE. Sense amplifier activation transistor PT6 is formed of a P-channel MOS transistor. Internal node 4b of sense amplifier 4 is coupled to the ground node. Bit-line precharging/equalizing circuit 6 has the same structure as that of Embodiment 1, and includes precharging N-channel MOS transistors NT4 and NT5, and an equalizing N-channel MOS transistor NT6.

Memory cell unit MU has the same structure as that of Embodiments 1 and 2, and includes first and second storage elements 1 and 2, and complementary data are stored in respective storage nodes SN and /SN thereof.

Figure 15:
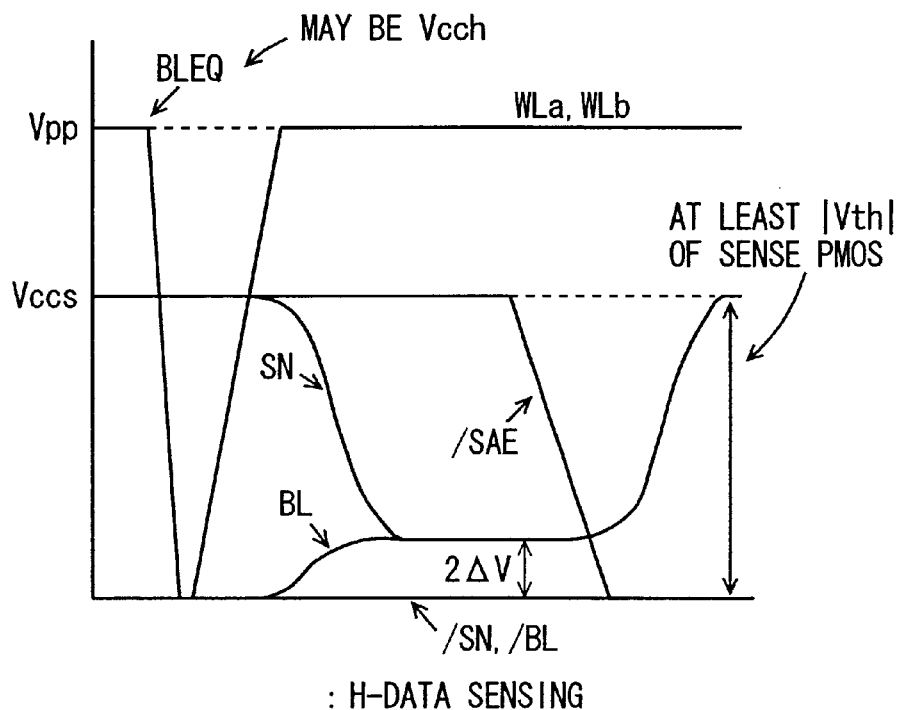
FIG. 15 is a signal waveform chart representing the H-data read operation in the structure shown in FIG. 14.

FIG. 15 is a signal waveform diagram representing an H-data reading operation of the structure shown in FIG. 14. Bit-line equalization instruction signal BLEQ is at the high voltage Vpp level during the standby cycle (standby state). Therefore, bit-line precharging/equalizing circuit 6 is activated to precharge and equalize bit lines BL and /BL to the ground voltage GND level. When an active cycle is started, bit-line equalization instruction signal BLEQ falls to the L level. Therefore, bit-line precharging/equalizing circuit 6 is deactivated, and bit lines BL and /BL are both brought into a floating state at the ground voltage level.

Storage nodes SN and /SN store the data at the sense power supply voltage Vccs level and ground voltage GND level, respectively. When a row selection operation is performed and word lines WLa and WLb are selected, the voltage on word lines WLa and WLb rises to the high-voltage Vpp level. In response to the voltage rise of word lines WLa and WLb, access transistors MT of memory cell unit MU are rendered conductive, whereby storage nodes SN and /SN are coupled to bit lines BL and /BL, respectively. Therefore, the voltage on bit line BL rises according to the H data stored in storage node SN, and the voltage levels on bit line BL and storage node SN become equal to each other. This voltage level on bit line BL is Vccs/(1+Cb/Cs). Therefore, a read voltage 2·ΔV is transmitted onto bit line BL.

Then, sense amplifier activation signal /SAE falls from the sense power supply voltage Vccs level to the ground voltage level, whereby sense amplifier activation transistor PT6 is responsively rendered conductive. Thus, P-channel MOS transistors PT1 and PT2 of sense amplifier 4 drive bit line BT up to the sense power supply voltage Vccs level. Since storage node /SN is at the ground voltage level, bit line /BL is maintained at the ground voltage level.

Figure 16:
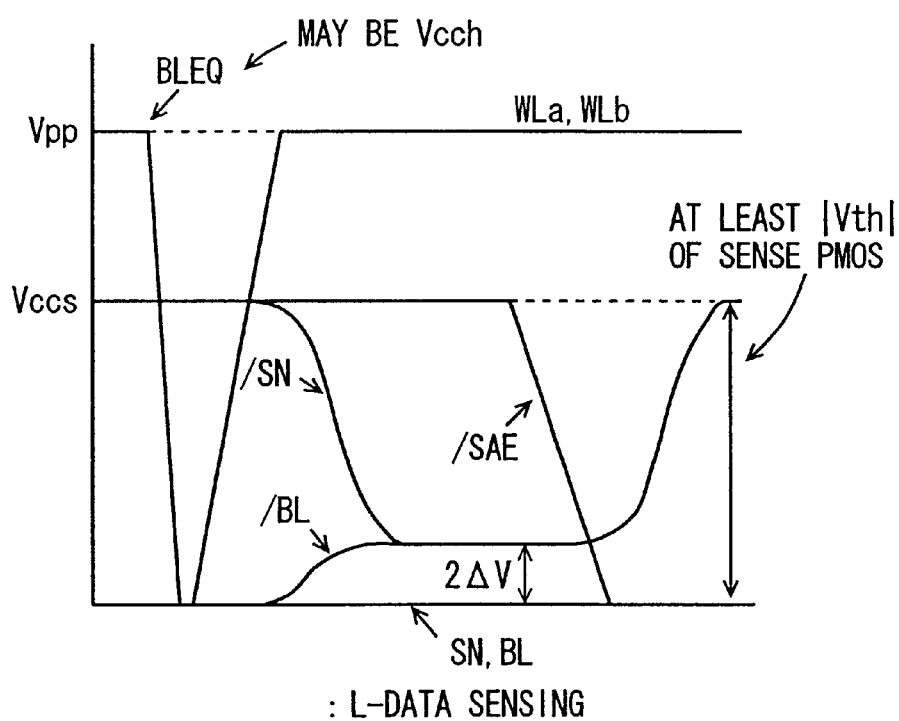
FIG. 16 is a signal waveform chart representing the L-data read operation in the structure shown in FIG. 14.

FIG. 16 is a signal waveform diagram representing an L-data read operation of the structure shown in FIG. 14. Upon reading the L data, storage node SN of memory cell unit MU stores L data at the ground voltage GND level, and storage node /SN thereof stores H data at the sense power supply voltage Vccs level. The L-data read operation is performed in the same manner as that of the H-data reading operation, and the voltage on bit line /BL rises to 2·ΔV. Thereafter, sense amplifier activation signal /SAE is activated, whereby the voltage level on bit line /BL rises to the sense power supply voltage Vccs level. Accordingly, although bit lines BL and /BL are precharged to the ground voltage GND, a read voltage 2·ΔV, which is twice the conventional read voltage ΔV, can be obtained. Thus, like Embodiments 1 and 2, a refresh-free semiconductor memory device can be implemented.

In sense amplifier 4, the P-channel MOS transistors receiving the ground voltage at their gates operate to raise the voltage to the sense power supply voltage Vccs level in the sensing operation. Accordingly, even if P-channel MOS transistors PT1 and PT2 of sense amplifier 4 have a large absolute value of threshold voltage, |Vth|, sense power supply voltage Vccs is sufficiently larger than the absolute value of threshold voltage of MOS transistors PT1 and PT2, whereby the sensing operation can be performed at a high speed. Moreover, the sensing operation can be stably performed even with a reduced sense power supply voltage Vccs.

Herein, bit lines BL and /BL are both precharged to the ground voltage level. Therefore, as soon as the voltage on word lines WLa and WLb rises to the level equal to or higher than the threshold voltage of access transistors MT of memory cell unit MU, access transistors MT are rendered conductive to electrically couple storage nodes SN and /SN to the respective bit lines BL and /BL. Therefore, the data can be read at fast timing. In addition, the following effects can be obtained by precharging the bit lines to the ground voltage.

Figure 17A:
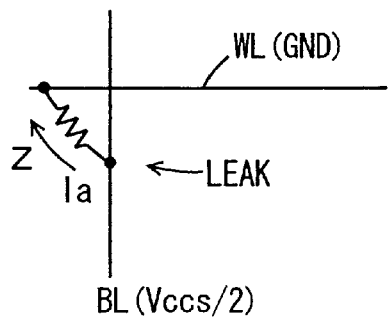
FIGS. 17A and 17B are diagrams illustrating advantages of Embodiment 3.

It is now assumed that word line WL and bit line BL are short-circuited due to a defect produced in the course of the manufacturing process, and are coupled through a resistance Z, as shown in FIG. 17A. Normally, in the case in which bit line BL and word line WL are short-circuited by resistance Z, the voltage on the selected word line WL does not rise to the high voltage Vpp level, and bit line BL is set to the voltage level different from that of the memory cell data due to the short-circuiting resistance Z. In order to repair such defective word line and the bit line, word line WL is replaced with a redundant word line. In such a case, however, word line WL is still present.

Accordingly, in the case where bit line BL is precharged to the intermediate voltage Vccs/2 and word line WL is at the ground voltage GND during the standby cycle, a leak current Ia flows from bit line BL into word line WL, whereby the standby current is increased. The magnitude of standby current Ia depends on the resistance value of short-circuiting resistance Z. However, in the case of a standard DRAM having the standby current standard of about 1 mA to about 2 mA, a standby current up to several tens of microamperes is allowable. In other words, a product having such short-circuit is used as an acceptable product. However, such a product cannot be used in memories for a portable equipment that requires an extremely low standby current in the range of several tens to several hundreds of microamperes.

Figure 17B:
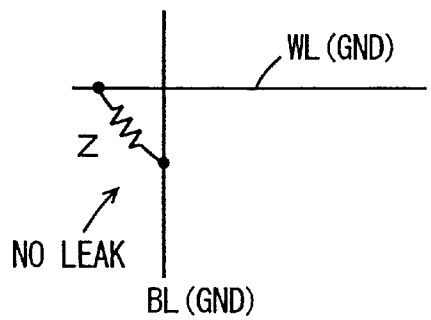

As shown in FIG. 17B, however, according to Embodiment 3, bit line BL is also precharged to the ground voltage GND level during the standby cycle. Even if the defective word line WL is replaced with a redundant word line, and is fixed at the ground voltage GND, the precharge voltage of bit line BL is equal to the voltage on word line WL. Therefore, even if short-circuiting resistance Z is present, no leak current is produced between bit line BL and word line WL during the standby cycle. Thus, such short-circuit between the word line and bit line, if any, can be reliably repaired by redundant replacement, whereby the resultant product can be applied to the portable equipment as a memory having an extremely low standby current. Thus, the manufacturing yield can be significantly improved.

Note that, in the signal waveforms of FIGS. 15 and 16, bit-line equalization instruction signal BLEQ is driven to the high-voltage Vpp level. However, bit-line precharging/equalizing circuit 6 need only transmit ground voltage GND onto bit lines BL and /BL. Therefore, bit-line equalization instruction signal BLEQ may be driven to the peripheral power supply voltage Vcch level when activated.

As has been described above, according to Embodiment 3, the bit lines are precharged to the ground voltage level during the standby cycle. Therefore, the following effects can be obtained in addition to the same effects as those of Embodiment 1 and 2: data stored in a memory cell unit can be read at fast timing, and no leak current is produced during the standby cycle even if the bit line and word line are short-circuited. Moreover, such a defect can be reliably repaired by the redundant replacement. Thus, the manufacturing yield can be significantly improved.

[Embodiment 4]

Figure 18:
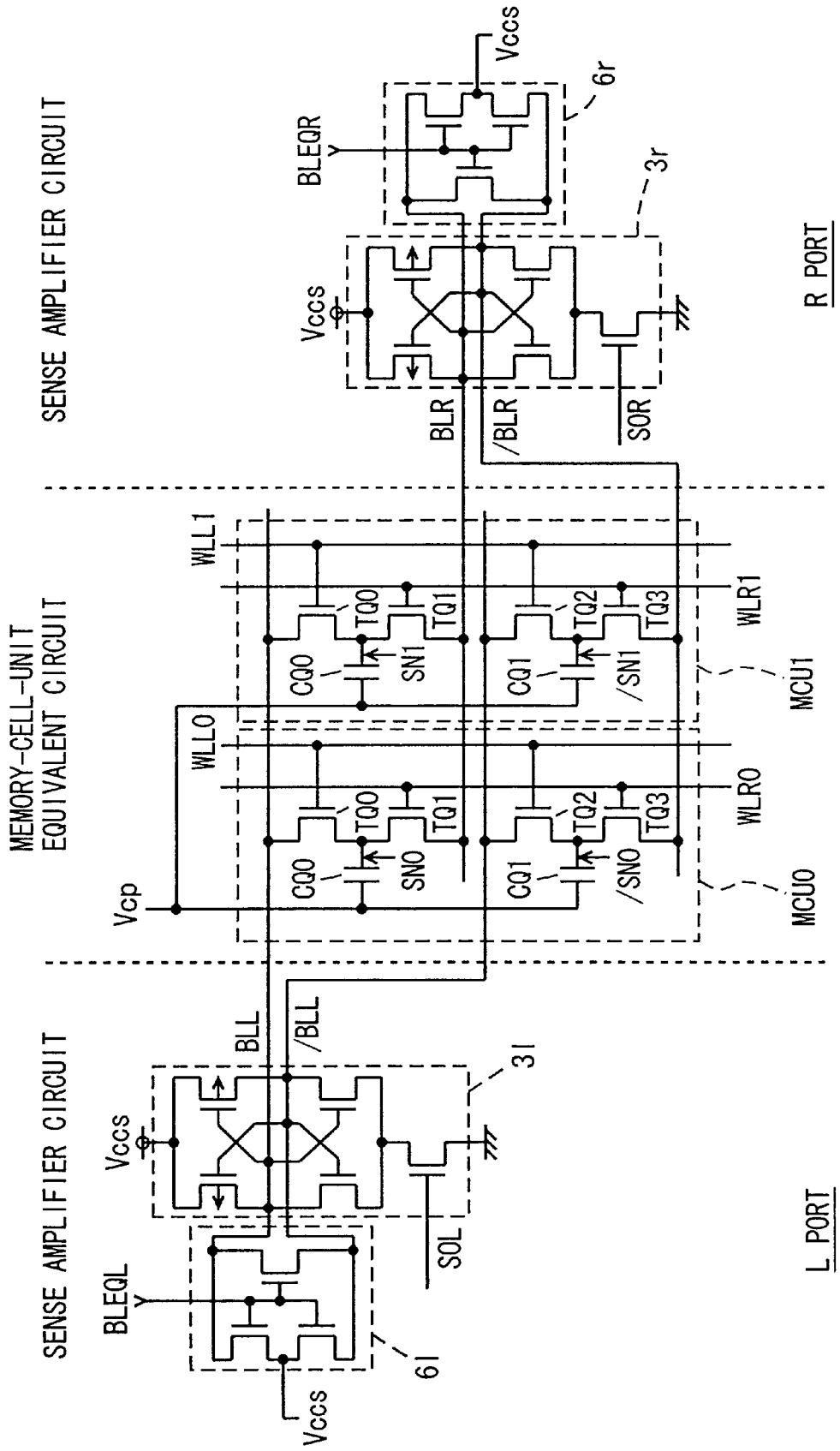
FIG. 18 is a diagram schematically showing the structure of the main part of a semiconductor memory device according to Embodiment 4 of the present invention.

FIG. 18 is a diagram showing the structure of a main part of a semiconductor memory device according to Embodiment 4 of the present invention. FIG. 18 shows the structure of a portion associated with the memory cell units arranged in two rows and one column. In the structure of FIG. 18, two word lines WLR and WLL are provided for each memory cell unit MCU, and two bit line pairs BLR, /BLR and BLL, /BLL are provided for each memory cell column. Word lines WLL and WLR can be driven into the selected state independently of each other. More specifically, the semiconductor memory device shown in FIG. 18 is a dual-port memory having an L port and an R port and allowing a row-access operation through these ports independently of each other.

A memory cell unit MCU0 is coupled to word lines WLR0 and WLL0, and a memory cell unit MCU1 is coupled to word lines WLR1 and WLL1.

Each of memory cell units MCU0 and MCU1 has first and second storage elements for storing complementary data. The first storage element includes: a memory cell capacitor CQ0 for storing information; a first L-port access transistor TQ0 for connecting a storage node SN (SN0, SN1) of memory cell capacitor CQ0 to bit line BLL in response to a signal on word line WLL (WLL0, WLL1); and a first R-port access transistor TQ1 for connecting storage node SN of memory cell capacitor CQ0 to bit line BLR in response to a signal on word line WLR (WLR0, WLR1).

The second storage element includes: a memory cell capacitor CQ1 for storing information; a second L-port access transistor TQ2 for coupling a storage node /SN (/SN0, /SN1) of memory cell capacitor CQ1 to bit line /BLL in response to the signal on word line WLL; and a second R-port access transistor TQ3 for connecting storage node /SN of memory cell capacitor CQ1 to bit line /BLR in response to the signal on word line WLR (WLR0, WLR1). Storage node SN (SN0, SN1) and storage node /SN (/SN0, /SN1) store complementary data.

An L-port bit-line precharging/equalizing circuit 6*l* and an L-port sense amplifier circuit 3*l* are provided for bit lines BLL and /BLL. An R-port bit-line precharging/equalizing circuit 6*r* and an R-port sense amplifier circuit 3*r* are provided for bit lines BLR and /BLR. These sense amplifier circuits 3*l* and 3*r* are activated according to sense amplifier activation signals SOL and SOR, respectively. Sense amplifier activation signals SOL and SOR are activated upon accessing the L-port and R-ports, respectively. Bit-line precharging/equalizing circuits 6*l* and 6*r* are selectively activated according to respective bit-line equalization instruction signals BLEQL and BLEQR. Bit-line precharging/equalizing circuits 6*l* and 6*r* transmit a sense power supply voltage Vccs onto respective bit lines BLL, /BLL and BLR, /BLR when activated (when the corresponding port is in the non-selected state). Bit-line equalization instruction signals BLEQL and BLEQR are at the high voltage Vpp level when activated.

A cell-plate voltage Vcp (=Vccs/2) is applied to respective cell-plate electrodes of memory cell capacitors CQ0 and CQ1 in memory cell units MCU0 and MCU1.

In the structure shown in FIG. 18, each memory cell unit MCU is formed by four transistors and two capacitors, and reads complementary data onto a corresponding bit line pair. Accordingly, like Embodiments 1 to 3, a read voltage 2·Δ that is twice the read voltage ΔV of the conventional one-transistor/one-capacitor memory cell can be produced on the bit lines. Moreover, bit lines BLL, /BLL and BLR, /BLR are precharged to the sense power supply voltage Vccs during the standby state of the corresponding port. Therefore, the sensing operation can be stably performed even under the low power supply voltage. Moreover, the sensing operation can be accurately performed even if the MOS transistors of sense amplifier circuits 3*l* and 3*r* have a high threshold voltage in absolute value. Furthermore, the active-standby leak current Icc3 can be reduced.

When word line WLR (WLR0 or WLR1) is selected, the memory cell data is read onto bit lines BLR and /BLR, and R-port sense amplifier circuit 3*r* senses and amplifies the data. When word line WLL (WLL0, WLL1) is selected, the memory cell data is read onto bit lines BLL and /BLL. Therefore, sense amplifier circuit 3*l* senses and amplifies the memory cell data. Sense amplifier activation signals SOL and SOR can be activated independently of each other. Accordingly, by alternately accessing the L port and R port, random access can be implemented at about twice the speed of the structure having only one access path to the memory cells such as one-transistor/one-capacitor type memory cells.

FIG. 19A is a signal waveform diagram representing an operation upon successively accessing the L port. As shown in FIG. 19A, in the standby state, L-port bit-line equalization instruction signal BLEQL is at the high voltage Vpp level, and L-port bit-line precharging/equalizing circuit 6*l* precharges bit lines BLL and /BLL to the sense power supply voltage Vccs level. When an active cycle is started, L-port bit-line equalization instruction signal BLEQL first falls to the L level. Then, a row selection operation is performed, and L-port word line WLL0 is first driven into the selected state. FIG. 19A shows the read waveforms in the case where storage node SN0 stores H data and storage node /SN0 stores L data.

When L-port word line WLL0 rises to the sense power supply voltage Vccs (plus a threshold voltage of the access transistors) or more, L-port access transistors TQ0 and TQ2 are both turned ON, whereby the data stored in the storage elements is transmitted onto bit lines BLL and /BLL. In this case as well, a read voltage 2·Δ appears on bit lines BLL and /BLL, respectively. Thereafter, L-port sense amplifier activation signal SOL is activated. L-port sense amplifier circuit 3*l* is responsively activated to differentially amplify the voltage on bit lines BLL and /BLL. By this sensing operation, bit line BLL is maintained at the sense power supply voltage Vccs level, whereas bit line /BLL is discharged down to the ground voltage level.

After the access to word line WLL0 is completed, L-port word line WLL0 is driven into the non-selected state. Then, L-port sense amplifier activation signal SOL is also deactivated to fall from the power supply voltage Vccs level to the ground voltage level. Thereafter, L-port bit-line equalization instruction signal BLEQL is activated to the high-voltage Vpp level, whereby bit line /BLL at the L level is precharged and equalized to the sense power supply voltage Vccs level. In the case where the L port is again to be accessed thereafter to drive L-port word line WLLn into the selected state, L-port bit-line equalization instruction signal BLEQL must be driven to the non-selected state.

FIG. 19B is an operation waveform diagram representing an operation upon alternately accessing the L port and R port. FIG. 19B shows the operation waveforms starting at the time Tb of FIG. 19A. At time Tb, L-port word line WLL0 is selected, and the sensing operation by L-port sense amplifier circuit 3*l* is started. In parallel with this, the R-port access is started, and R-port bit-line equalization instruction signal BLEQR is rendered L-level, whereby the R-port active cycle is started. After R-port bit-line equalization instruction signal BLEQR falls to the L level, a row selection operation is performed, and R-port word line WLR1 is driven into the selected state.

When R-port word line WLR1 is selected, the data stored in memory cell unit MCU1 is read onto bit lines BLR and /BLR. FIG. 19B also shows the signal waveforms upon reading the H data from memory cell unit MCU1. Therefore, when the voltage difference between bit lines BLR and /BLR becomes equal to 2·Δ, R-port sense amplifier activation signal SOR is activated. R-port sense amplifier circuit 3*r* is responsively activated to differentially amplify the voltage on bit lines BLR and /BLR. By this sensing operation, R-port bit line BLR is maintained at the sense power supply voltage Vccs level, whereas R-port bit line /BLR is discharged down to the ground voltage level.

Sense amplifier circuit 3*r* is activated independently of sense amplifier circuit 3*l*. L-port bit lines BLL, /BLL and R-port bit lines BLR, /BLR are separate data lines. Therefore, R-port sense amplifier circuit 3*r* can be activated to amplify and latch the data on R-port bit lines BLR and /BLR while L-port sense amplifier 31 latches the voltages on L-port bit lines BLL and /BLL in the L-port row access operation. In this case, such an operation in the R port does not adversely affect the L-port access operation. Accordingly, by accessing the R port after the L port has been accessed, high-speed access can be implemented without so-called RAS precharge time. In other words, by alternately access the L port and R port, high-speed random access can be implemented without any overhead upon page switching.

Figure 20:
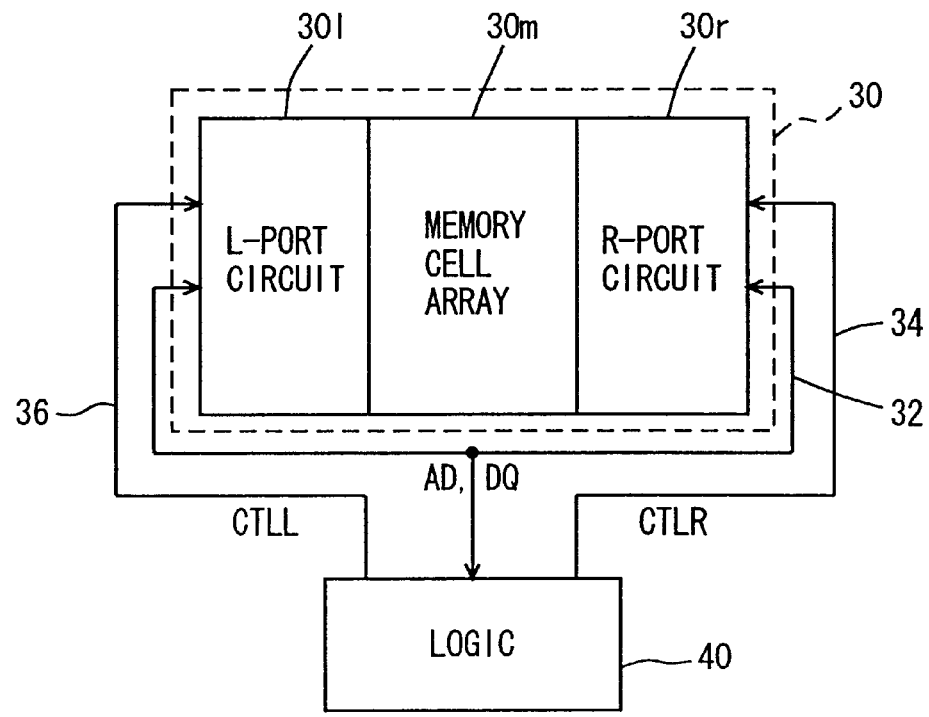
FIG. 20 is a diagram showing one example of the system structure of the semiconductor memory device according to Embodiment 4.

FIG. 20 is a diagram showing one example of the system structure of a semiconductor memory device according to Embodiment 4 of the present invention. In FIG. 20, semiconductor memory device 30 includes a memory cell array 30m for storing information, an L-port circuit 30l for making an access from the L port of memory cell array 30m, and an R-port circuit 30r for making an access from the R port of memory cell array 30m. L-port word lines, R-port word lines, R-port bit lines and L-port bit lines are provided in memory cell array 30m. L-port circuit 30l includes an L-port sense amplifier circuit, an L-port bit-line precharging/equalizing circuit, an L-port row selection circuit, an L-port column selection circuit and an L-port input/output (I/O) circuit. R-port circuit 30r includes an R-port sense amplifier circuit, an R-port bit-line precharging/equalizing circuit, an R-port row selection circuit, an R-port column selection circuit and an R-port I/O circuit.

This semiconductor memory device 30 transmits and receives the data to and from a logic (or memory controller) 40. Logic 40 transmits and receives an address signal AD and data DQ to and from R-port circuit 30r and L-port circuit 30l through an address/data bus 32. In addition, logic 40 applies an R-port control signal CTLR to R-port circuit 30r through an R-port control bus 34, and applies an L-port control signal CTLL to L-port circuit 30l through an L-port control bus 36. Thus, data access can be performed by selectively activating L-port circuit 30l and R-port circuit 30r according to control signals CTLL and CTLR under the control of logic 40.

Figure 21:
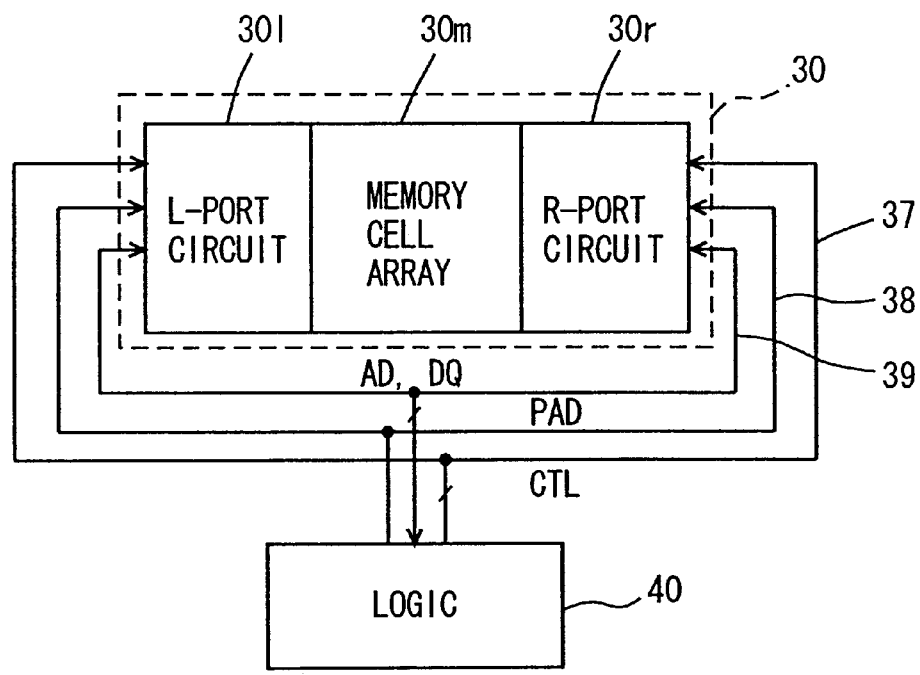
FIG. 21 is a diagram schematically showing a modification of the system structure of the semiconductor memory device according to Embodiment 4.

FIG. 21 is a diagram showing a modification of the system structure of the semiconductor memory device according to Embodiment 4. Logic 40 applies a common control signal CLT to R-port circuit 30r and L-port circuit 30l through a control bus 37. In addition, logic 40 transmits and receives address signal AD and data DQ thorough an address/data bus 39. Logic 40 also applies a port address PAD for specifying a port to L-port circuit 30l and R-port circuit 30r through an address bus 38. This port address PAD designates R-port circuit 30r and L-port circuit 30l. Therefore, R-port circuit 30r and L-port circuit 30l as designated by port address PAD operate according to received control signal CTL.

In the structure of FIG. 21, common control signal CTL can be applied to R-port circuit 30r and L-port circuit 30l.

Figure 22:
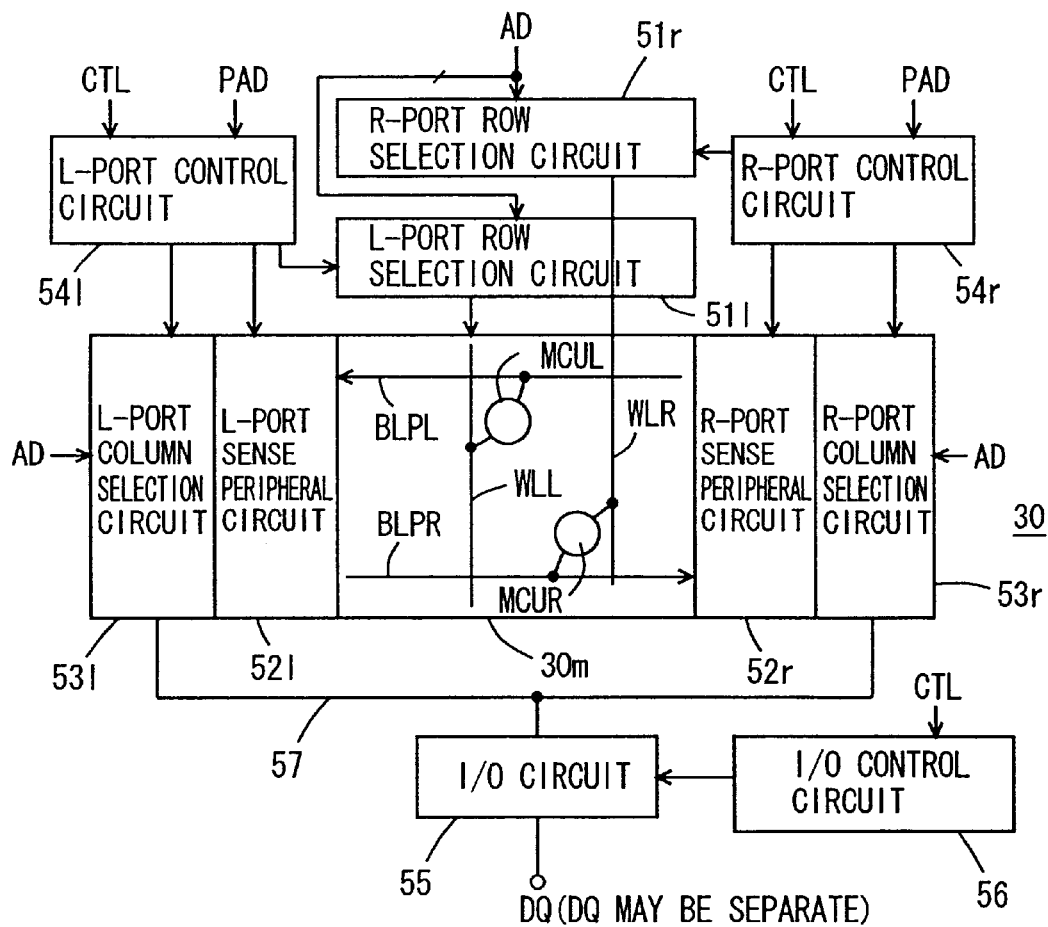
FIG. 22 is a diagram schematically showing the structure of the semiconductor memory device shown in FIG. 21.

FIG. 22 is a diagram schematically showing one example of the overall structure of the semiconductor memory device according to Embodiment 4. The semiconductor memory device shown in FIG. 22 is applied to the system structure of FIG. 21, and receives control signal CTL, port address PAD, address AD and data DQ from logic 40.

In FIG. 22, semiconductor memory device 30 includes memory cell array 30m. R-port word lines WLR, L-port word lines WLL, L-port bit line pairs BLPL and R-port bit line pairs BLPR are provided in memory cell array 30m. An L-port memory cell unit MCUL is provided at each intersection of L-port word lines WLL and L-port bit line pairs BLPL, and an R-port memory cell unit MCUR is provided at each intersection of R-port bit line pairs BLPR and R-port word lines WLR. Memory cell units MCUL and MCUR form a single memory cell unit MCU.

Semiconductor memory device 30 further includes: an R-port row selection circuit 51r for selecting an R-port word line of memory cell array 30m according to an address signal AD; an L-port row selection circuit 51l for selecting an L-port word line of memory cell array 30m according to address signal AD; an L-port sense periphery circuit 52l for sensing and amplifying the voltage on an L-port bit line pair; an R-port sense periphery circuit 52r for sensing and amplifying the voltage on each bit line pair of memory cell array 30m; an L-port column selection circuit 53l for selecting a column of memory cell array 30m according to address signal AD; and an R-port column selection circuit 53r for selecting a column (bit line pair) of memory cell array 30m according to address signal AD.

Each of L-port sense periphery circuit 52l and R-port sense periphery circuit 52r includes a sense amplifier—circuit, bit-line precharging/equalizing circuit, a bit-line isolation gate, and the like. Each of L-port column selection circuit 53l and R-port column selection circuit 53r selects a bit line pair (sense amplifier circuit) corresponding to an addressed column. R-port column selection circuit 53r and L-port column selection circuit 53l are coupled to an I/O circuit 55 through an internal data bus 57.

In order to control the operation of semiconductor memory device 30, an R-port control circuit 54r for controlling the operation of the peripheral circuitry associated with the R port according to control signal CTL and port address PAD, an L-port control circuit 54l for controlling the operation of the circuitry in the L port according to control signal CTL and port address PAD, and an I/O control circuit 56 for controlling the data input/output operation of I/O circuit 55 according to control signal CTL are provided.

In the structure of FIG. 22, when port address PAD designates the R port, R-port control circuit 54r performs required operation control according to control signal CTL. When port address PAD designates the L port, L-port control circuit 54l performs required operation control according to control signal CTL. When control signal CTL instructs data input or output, I/O control circuit 56 controls the operation of I/O circuit 55 independent of the port address.

In the structure of FIG. 22, I/O circuit 55 is common to the L port and R port. Therefore, by alternately designating the L port and R port by using port address PAD, high-speed access can be implemented.

It should be noted that, in the structure of FIG. 22, data DQ may be transmitted separately, i.e., write data D and read data Q may be transmitted through separate paths.

Figure 23:
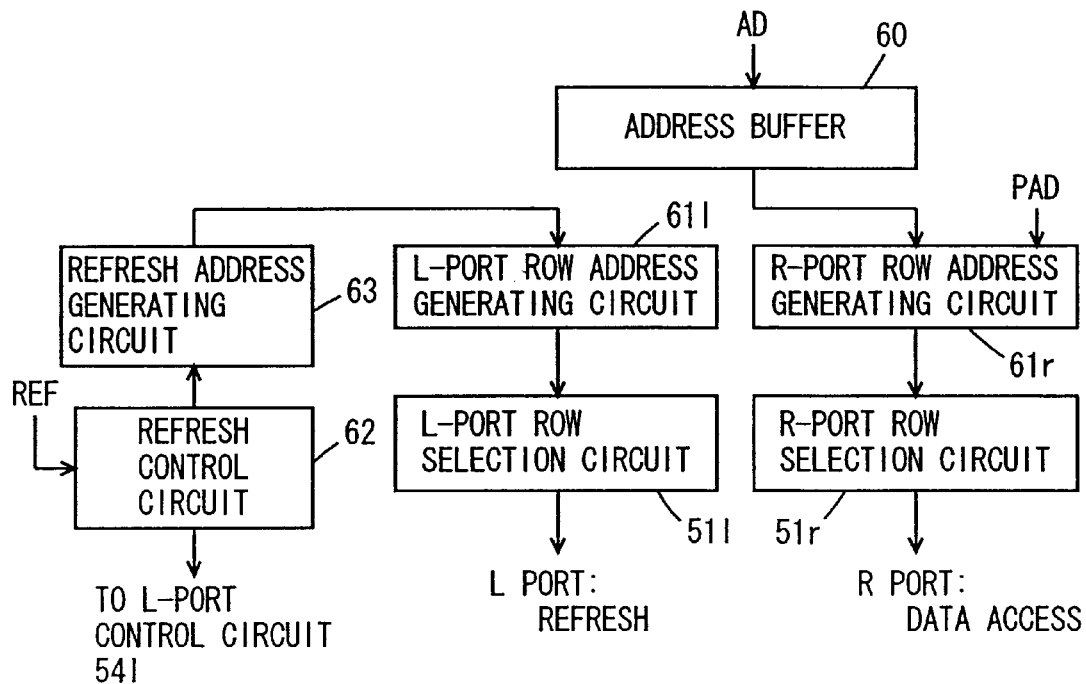
FIG. 23 is a diagram showing a modification of the semiconductor memory device shown in FIG. 22.

FIG. 23 is a diagram schematically showing the structure of a modification of the semiconductor memory device shown in FIG. 22. In FIG. 23, an L-port row address generating circuit 61l and an R-port row address generating circuit 61r are provided for L-port row selection circuit 51l and R-port row selection circuit Sir, respectively. When port address PAD designates the R port, R-port row address generating circuit 61r receives the address signal from an address buffer 60 as a row address signal, and applies the received signal to R-port row selection circuit 51r. L-port row address generating circuit 61l selects a refresh address applied from a refresh address generating circuit 63, and applies the selected address to L-port row selection circuit 51l.

Refresh address generating circuit 63 is controlled by a refresh control circuit 62 for issuing a refresh request and updating the refresh address according to a refresh instruction signal (or refresh command) REF. The refresh request from refresh control circuit 62 is applied to L-port control circuit 54l of FIG. 22. Accordingly, when refresh control circuit 62 issues a refresh request, L-port row address generating circuit 61l receives a refresh address from refresh address generating circuit 63 and applies the received refresh address to L-port row selection circuit 51l under the control of L-port control circuit 54l. R-port row address generating circuit 61r receives an address applied externally under the control of R-port control circuit 54r shown in FIG. 22 according to an external control signal. Thus, in the structure of FIG. 23, the L port is exclusively used as a refresh port, and the R port is exclusively used as a data access port. Therefore, a refresh operation need not be considered upon data access to the R port, whereby the data access can be performed in a refresh-free manner.

It should be noted that each of L-port row address generating circuit 61*l* and R-port row address generating circuit 61*r* may include a multiplexer for receiving the address signal from address buffer 60 and refresh address from refresh address generating circuit 63, and a row address buffer for receiving an output signal of the multiplexer to generate an internal row address. The multiplexer of L-port row address generating circuit 61*l* is fixedly set to select a refresh address from refresh address generating circuit 63. The multiplexer of R-port row address generating circuit 61*r* is fixedly set to select an address signal from address buffer 60. Such setting of the multiplexers may be performed through mask interconnection, or may be performed according to operation-mode instruction data that is stored in a mode register or the like according to an external control signal.

[Modification 1]

Figure 24:
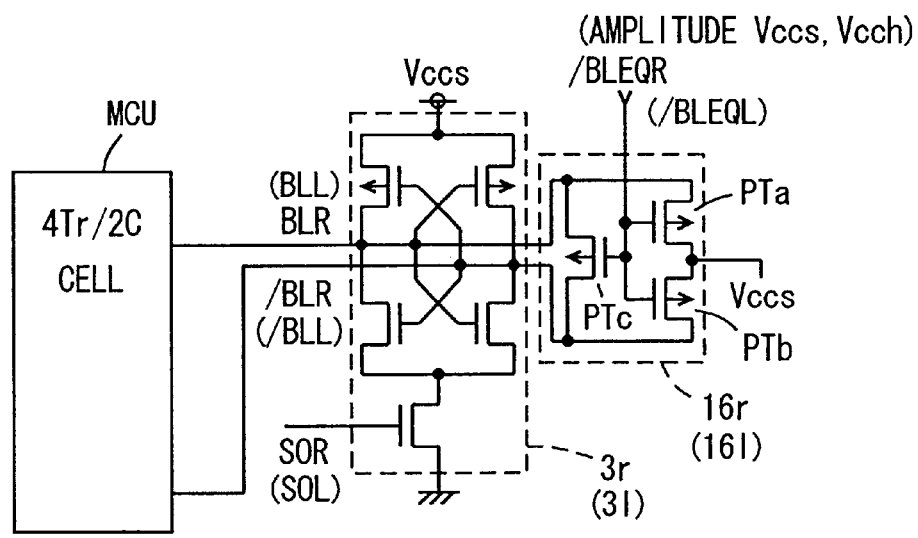
FIG. 24 is a diagram schematically showing the structure of a main part of Modification 1 of Embodiment 4.

FIG. 24 is a diagram showing the structure of Modification 1 of Embodiment 4. Although only the R-port structure is shown in FIG. 24, the L port has the same structure. In FIG. 24, corresponding components of the L port are denoted with the reference numerals and characters in parentheses.

In FIG. 24, a bit-line precharging/equalizing circuit 16*r* includes: P-channel MOS transistors PTa and PTb rendered conductive in response to activation (L level) of a bit-line equalization instruction signal /BLEQR, for transmitting a sense power supply potential Vccs onto bit lines BLR and /BLR; and a P-channel MOS transistor PTc rendered conductive in response to activation of bit-line equalization instruction signal /BLEQR, for electrically short-circuiting bit lines BLR and /BLR. The remaining structure is the same as that shown in FIG. 18. A memory cell unit MCU including four transistors (Tr) and two capacitors (C) is coupled to bit lines BLR and /BLR.

In the structure of FIG. 24, bit-line equalization instruction signal /BLEQR having an amplitude Vccs or Vcch (periphery power supply potential) is applied to bit-line precharging/equalizing circuit 16*r*. Thus, the amplitude of bit-line equalization instruction signals /BLEQR and /BLEQL can be reduced, whereby current consumption for bit-line equalization instruction signals /BLEQ can be reduced.

[Modification 2]

Figure 25:
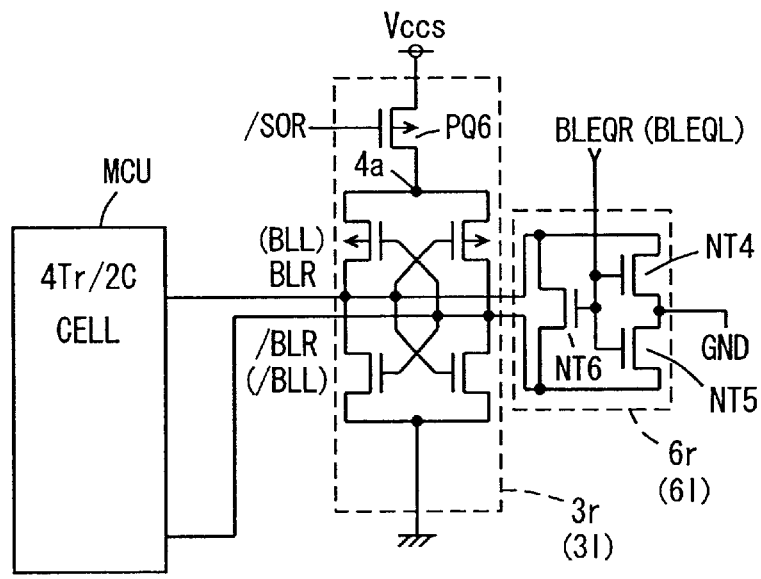
FIG. 25 is a diagram schematically showing the structure of the main part of Modification 2 of Embodiment 4.

FIG. 25 is a diagram showing the structure of Modification 2 of Embodiment 4. Although only the R-port structure is shown in FIG. 25, the L port has the same structure. In FIG. 25, corresponding components of the L port are denoted with the reference numerals and characters in parentheses. In FIG. 25, bit-line precharging/equalizing circuit 6*r* transmits the ground voltage GND onto bit lines BLR and /BLR in response to activation of bit-line equalization instruction signal BLEQR. Bit lines BLR and /BLR are precharged to the ground voltage GND level. Therefore, in sense amplifier circuit 3*r*, a sense power supply node 4*a* of the sense amplifier (cross-coupled MOS transistor pair) is coupled to the sense power supply node through a P-channel MOS transistor PQ6 that is rendered conductive in response to activation of a sense amplifier activation signal /SOR. Cross-coupled N-channel MOS transistors of sense amplifier circuit 3*r* have their source nodes normally coupled to the ground node.

In the structure of FIG. 25, bit lines BLR, /BLR, BLL and /BLL are all precharged to the ground voltage GND level in the precharging operation (in the standby state). Therefore, like Embodiment 3, high-speed sensing operation can be performed with low current consumption, and the manufacturing yield is also improved.

Bit-line equalization instruction signals BLEQR and BLEQL may have an amplitude of any of periphery power supply potential Vcch, high voltage Vpp and sense power supply potential Vccs.

Figure 26:
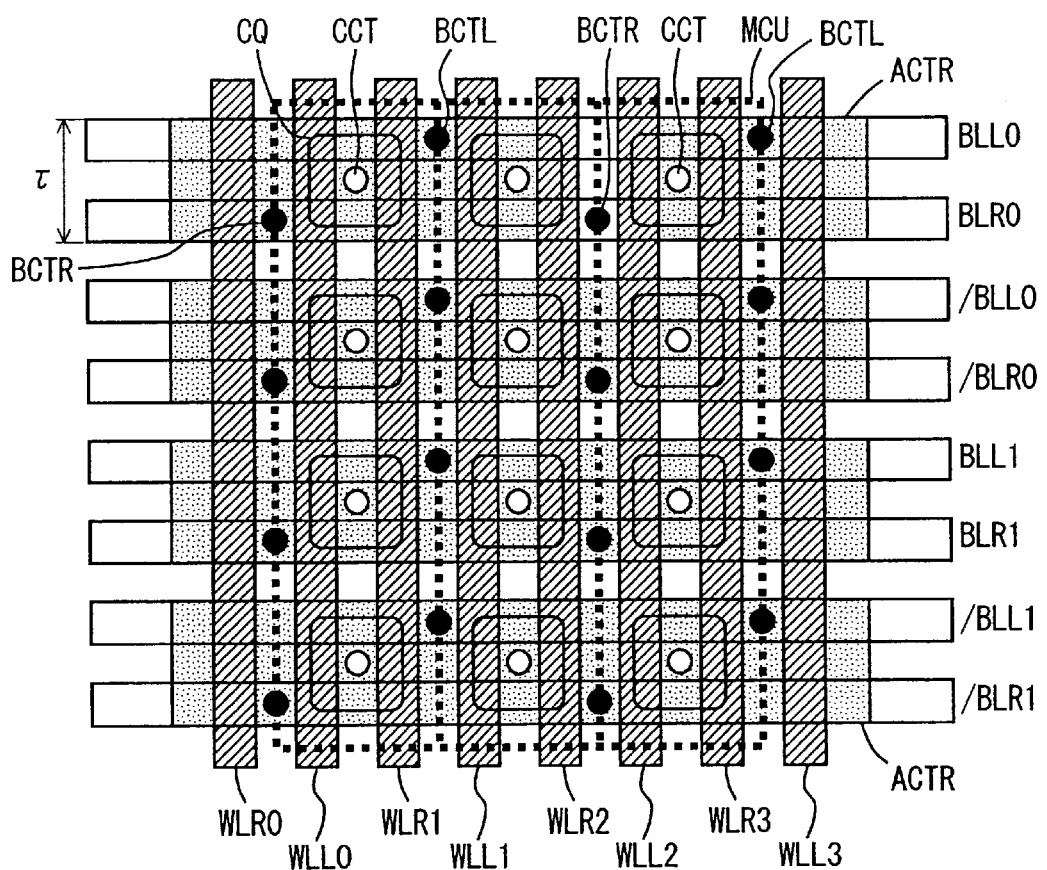
FIG. 26 is a diagram schematically showing the layout of an array portion of the semiconductor memory device according to Embodiment 4.

FIG. 26 is a diagram schematically showing the layout of a memory array portion of the semiconductor memory device according to Embodiment 4. In FIG. 26, L-port bit lines BLL0, /BLL0, BLL1 and /BLL1 extend in the column direction. R-port bit lines BLR0, /BLR0, BLR1 and /BLR1 also extend in the column direction alternately with bit lines BLL0, /BLL0, BLL1 and /BLL1. Adjacent two bit lines BLL and BLR or /BLL and /BLR form a bit-line set. Element active regions ACTR extend in the column direction so as to overlap or align with the bit line pair of the corresponding set as viewed two-dimensionally. Element active regions ACTR are high-concentration impurity regions, in which the source/drain regions of the access transistors are formed. L-port bit-line contacts BCTL for contact with the corresponding L-port bit lines BLL0, /BLL0, BLL1 and /BLL1 are formed every five rows in the column direction. These L-port bit-line contacts BCTL align in the row direction.

R-port bit-line contacts BCTR for contact of the element active regions with the corresponding R-port bit lines BLR0, /BLR0, BLR1 and /BLR1 are formed every five rows in the column direction. These R-port bit-line contacts BCTR align in the row direction.

R-port word lines WLR0 to WLR3 extending in the row direction are provided adjacent to the bit line contacts aligned in the row direction. L-port word lines WLL0 to WLL3 are provided alternately with R-port word lines WLR0 to WLR3. R-port word line WLR and L-port word line WLL sandwich the R-port bit-line contacts BCTR or L-port bit-line contacts BCTL. Capacitors CQ are each formed in a region between and under adjacent two word lines so as to align in the row and column directions. Each capacitor contact CCT is formed between the bit line contacts BCTR and BCTL arranged in the point-symmetric relation. These capacitor contacts CCT align in the row and column directions. More specifically, capacitor contact CCT is formed every three word lines in the column direction, and every three bit lines in the row direction. A region including two L-port bit-line contacts BCTL aligning in the row direction, two R-port bit-line contacts BCTR aligning in the column direction and two capacitor contacts CCT aligning in the row direction forms a single memory cell unit MCU.

In FIG. 26, L-port bit lines BLL and R-port bit lines BLR are alternately arranged, and L-port bit-line contacts BCTL and R-port bit-line contacts BCTR are alternately provided along the column direction. In each memory cell unit MCU, bit-line contacts BCTR and BCTL are located opposite to each other with respect to the corresponding capacitor contact CCT.

The element active regions ACTR located adjacent to each other in the row direction are isolated from each other by element isolation regions. Each element active region ACTR is a rectangular region extending in the column direction, which simplifies the layout of the element active regions. In other words, the element isolation regions for isolating the element active regions ACTR can be formed so as to linearly extend in the column direction. Thus, the layout is facilitated as compared to the structure having reversed-T-shaped element active regions.

The access transistors have a channel width equal to the length τ occupied by the bit line set BLL, BLR in the row direction, thereby providing a sufficiently large channel width (gate width) of the access transistors. As a result, the access transistors can have sufficiently large current driving capability, whereby data can be read from and write to the memory cell units at a high speed.

L-port bit lines BLL (/BLL) and R-port bit lines BLR (/BLR) are alternately arranged. Therefore, except for the case where the sensing operation is simultaneously performed in the L port and R port, the bit lines of one port are fixed at a prescribed voltage (power supply potential or ground voltage) by the sense amplifier circuitry or bit-line precharging/equalizing circuitry while the sensing operation is performed in the other port. Accordingly, during the sensing operation in the other port, the bit lines in one port serve as a shielding layer for the bit lines in the other port. As a result, the sensing noise resulting from capacitive coupling between the bit lines is reduced, whereby the sensing operation can be accurately performed.

In the structure of FIG. 26, the element active regions for forming first unit elements and the element active regions for forming second unit elements are alternately arranged in the row direction. Therefore, the first unit elements and second unit elements can be regularly arranged in the same layout pattern so as to align in the row direction. The first unit elements are storage elements connected to the bit line BLL or BLR, and the second unit elements are storage elements connected to the bit line /BLL or /BLR.

It should be noted that element active regions ACTR are isolated from the peripheral circuitry along the column direction by the corresponding element isolation regions.

As has been described above, according to Embodiment 4, a single memory cell unit is formed of four transistors and two capacitors, and each memory cell unit is accessible through two ports. Moreover, the bit lines are fixed at the power supply potential or ground voltage level. Therefore, a semiconductor memory device accessible at a high speed and operating stably under a low power supply voltage with low current consumption can be implemented.

[Other Applications]

In the foregoing description, cell-plate voltage Vcp is set to the intermediate voltage, Vccs/2 level. However, sense power supply voltage Vccs may be used as cell-plate voltage Vcp as long as the break-down voltage of the insulating film in memory cell capacitor CQ or Cs is assured.

It should be noted that the semiconductor memory device according to the present invention is most suitable for integration into the system LSI for use in a portable equipment. In the case of the two-cell/bit structure, the number of elements is reduced as compared to the SRAM (static random access memory), whereby the memory size is reduced. Accordingly, a memory occupying a small area, and operating, like the SRAM, with a low power supply voltage, and further being accessible at a high speed with a low data holding current due to the long refresh intervals can be implemented.

In a four-transistor/two-capacitor type memory cell unit as well, the structure is simplified as compared to the SRAM cell, and the unit cell size can be made smaller than that of the SRAM. In addition, by using a dual port, a refresh-free, high-speed memory that can replace the SRAM can be implemented.

The word lines may have a hierarchical structure. In this case, the word lines of each embodiment need only be regarded as sub-word lines to which the memory cells are connected.

The memory cells may be desirably arranged as long as complementary memory cell data is read onto a corresponding bit line pair upon selection of a word line.

As has been described above, according to the present invention, complementary data are read onto a corresponding bit line pair when a word line is selected. Moreover, the bit lines are precharged to the power supply voltage or ground voltage level. As a result, a semiconductor memory device operating stably with low current consumption even under a low power supply voltage can be obtained.

Although the present invention has been described and illustrated in detail, it is clearly understood that the same is by way of illustration and example only and is not to be taken by way of limitation, the sprit and scope of the present invention being limited only by the terms of the appended claims.

What is claimed is:

1. A semiconductor memory device, comprising:
   a plurality of unit cells arranged in rows and columns, each of said plurality of unit cells having first and second storage elements, each of said first and second storage elements including a capacitor for storing information and an access transistor;
   a plurality of bit line pairs provided corresponding to the respective columns, each of the bit line pairs connecting to the unit cells on a corresponding column, each of the bit line pairs including first and second bit lines respectively coupled to said first and second storage elements of the unit cells of the corresponding column;
   a plurality of row selection lines provided corresponding to the respective rows, each of the row selection lines connecting to the unit cells of a corresponding, each of the row selection lines including a first word line connecting to the first storage elements of the unit cells on a corresponding row, and a second word line connecting to the second storage elements of the unit cells on the corresponding row;
   a row selection circuit for simultaneously driving the first and second word lines of a row selection line arranged corresponding to an addressed row into a selected state according to an address signal; and
   a bit-line voltage setting circuit for setting voltages on the first and second bit lines of each of said bit line pairs to a voltage level different from an intermediate voltage level in a standby state, the intermediate voltage level being equal to half a sum of voltages respectively corresponding to high-level and low-level data stored in said first and second storage elements.

2. The semiconductor memory device according to claim 1, wherein said bit-line voltage setting circuit sets said first and second bit lines to a power supply voltage level in the standby state.

3. The semiconductor memory device according to claim 1, wherein said bit-line voltage setting circuit sets said first and second bit lines to a ground voltage level in said standby state.

4. The semiconductor memory device according to claim 1, further comprising:
   a plurality of sense amplifier circuits, provided corresponding to the bit line pairs, each activated to differentially amplify voltage on the first and second bit lines of a corresponding bit line pair, each of said plurality of sense amplifier circuits including: a first insulated-gate field effect transistor of a first conductivity type connected between a first power supply node and said first bit line of a corresponding bit line pair and having a gate thereof connected to said second bit line of said corresponding bit line pair; a second insulated-gate field effect transistor of the first conductivity type connected between said first power supply node and said second bit line and having a gate thereof connected to said first bit line of said corresponding bit line pair; a third insulated-gate field effect transistor of a second conductivity type connected between said first bit line and an internal node and having a gate thereof connected to said second bit line; a fourth insulated-gate field effect transistor of the second conductivity type connected between said second bit line and said internal node and having a gate connected to said first bit line; and a fifth insulated-gate field effect transistor of the second conductivity type, provided for each predetermined number of the sense amplifier circuit(s), rendered conductive in response to activation of a sense amplifier activation signal for coupling said internal node to a second power supply node, wherein said bit-line voltage setting circuit sets the respective voltages on said first and second bit lines to said voltage level equal to a voltage at said first power supply node in said standby state.

5. The semiconductor memory device according to claim 1, wherein said bit-line voltage setting circuit includes P-channel insulated-gate field effect transistors provided corresponding to said plurality of bit line pairs, said P-channel insulated-gate field effect transistors being rendered conductive in said standby state for transmitting the voltage corresponding to the high-level data stored in said first and second storage elements onto corresponding first and second bit lines.

6. The semiconductor memory device according to claim 5, wherein said bit-line voltage setting circuit further includes P-channel insulated-gate field effect transistors provided corresponding to the bit line pairs for electrically short-circuiting the first and second bit lines of corresponding bit line pairs in said standby state.

7. The semiconductor memory device according to claim 1, wherein said bit-line voltage setting circuit includes N-channel insulated-gate field effect transistors provided corresponding to said plurality of bit line pairs, said N-channel insulated-gate field effect transistors being rendered conductive in said standby state for transmitting the voltage corresponding to the low-level data stored in said first and second storage elements onto the first and second bit lines of corresponding bit line pairs.

8. The semiconductor memory device according to claim 7, wherein said bit-line voltage setting circuit further includes N-channel insulated-gate field effect transistors provided corresponding to said plurality of bit line pairs for electrically short-circuiting the first and second bit lines of corresponding bit line pairs in said standby state.

* * * * *